(12) United States Patent
Hsiung et al.

(10) Patent No.: US 12,087,832 B2
(45) Date of Patent: Sep. 10, 2024

(54) SEMICONDUCTOR DEVICE INTERCONNECTS AND METHODS OF FORMATION

(71) Applicant: Taiwan Semiconductor Manufacturing Company, Ltd., Hsinchu (TW)

(72) Inventors: Te-Chih Hsiung, Taipei (TW); I-Hung Li, New Taipei (TW); Yi-Ruei Jhan, Hsinchu (TW); Yuan-Tien Tu, Puzih (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 175 days.

(21) Appl. No.: 17/303,002

(22) Filed: May 18, 2021

(65) Prior Publication Data

US 2022/0320300 A1    Oct. 6, 2022

Related U.S. Application Data

(60) Provisional application No. 63/200,864, filed on Mar. 31, 2021.

(51) Int. Cl.
*H01L 29/417* (2006.01)
*H01L 21/768* (2006.01)
(Continued)

(52) U.S. Cl.
CPC .. *H01L 29/41775* (2013.01); *H01L 21/76877* (2013.01); *H01L 21/76883* (2013.01); *H01L 21/76895* (2013.01); *H01L 23/5221* (2013.01); *H01L 23/5283* (2013.01); *H01L 29/401* (2013.01); *H01L 29/41791* (2013.01);
(Continued)

(58) Field of Classification Search
CPC ............. H01L 23/5221; H01L 23/5283; H01L 29/41775; H01L 21/76877; H01L 21/76883; H01L 21/76895; H01L 29/401; H01L 29/41791; H01L 29/42356; H01L 29/66795; H01L 29/785; H01L 27/0886;
(Continued)

(56) References Cited

U.S. PATENT DOCUMENTS

| | | | |
|---|---|---|---|
| 2019/0385946 A1* | 12/2019 | Xie | .................... H01L 21/76895 |
| 2020/0043787 A1* | 2/2020 | Su | .......................... H01L 23/535 |
| 2020/0098891 A1* | 3/2020 | Bih | ........................ H01L 21/326 |

\* cited by examiner

*Primary Examiner* — Farun Lu
(74) *Attorney, Agent, or Firm* — Harrity & Harrity, LLP

(57) ABSTRACT

A first interconnect structure (e.g., a gate interconnect) of a butted contact (BCT) is etched and filled. The first interconnect structure is then etched back such that a portion of the first interconnect structure is removed, then a second interconnect structure and the remaining portion of the first interconnect structure are filled. In this way, the height of the remaining portion of the first interconnect structure that is to be filled is closer to the height of the second interconnect structure when the second interconnect structure is filled relative to fully filling the second interconnect structure and fully filling the first interconnect structure in a single deposition operation. This reduces the likelihood that filling the second interconnect structure will close the first interconnect structure before the first interconnect structure can be fully filled, which may otherwise result in the formation of a void in the first interconnect structure.

20 Claims, 22 Drawing Sheets

(51) Int. Cl.
*H01L 23/522* (2006.01)
*H01L 23/528* (2006.01)
*H01L 27/088* (2006.01)
*H01L 29/40* (2006.01)
*H01L 29/423* (2006.01)
*H01L 29/66* (2006.01)
*H01L 29/78* (2006.01)
*H10B 10/00* (2023.01)

(52) U.S. Cl.
CPC .. *H01L 29/42356* (2013.01); *H01L 29/66795* (2013.01); *H01L 29/785* (2013.01); *H10B 10/12* (2023.02); *H01L 27/0886* (2013.01)

(58) Field of Classification Search
CPC ........... H01L 21/76804; H01L 23/5226; H01L 23/4824; H10B 10/12
See application file for complete search history.

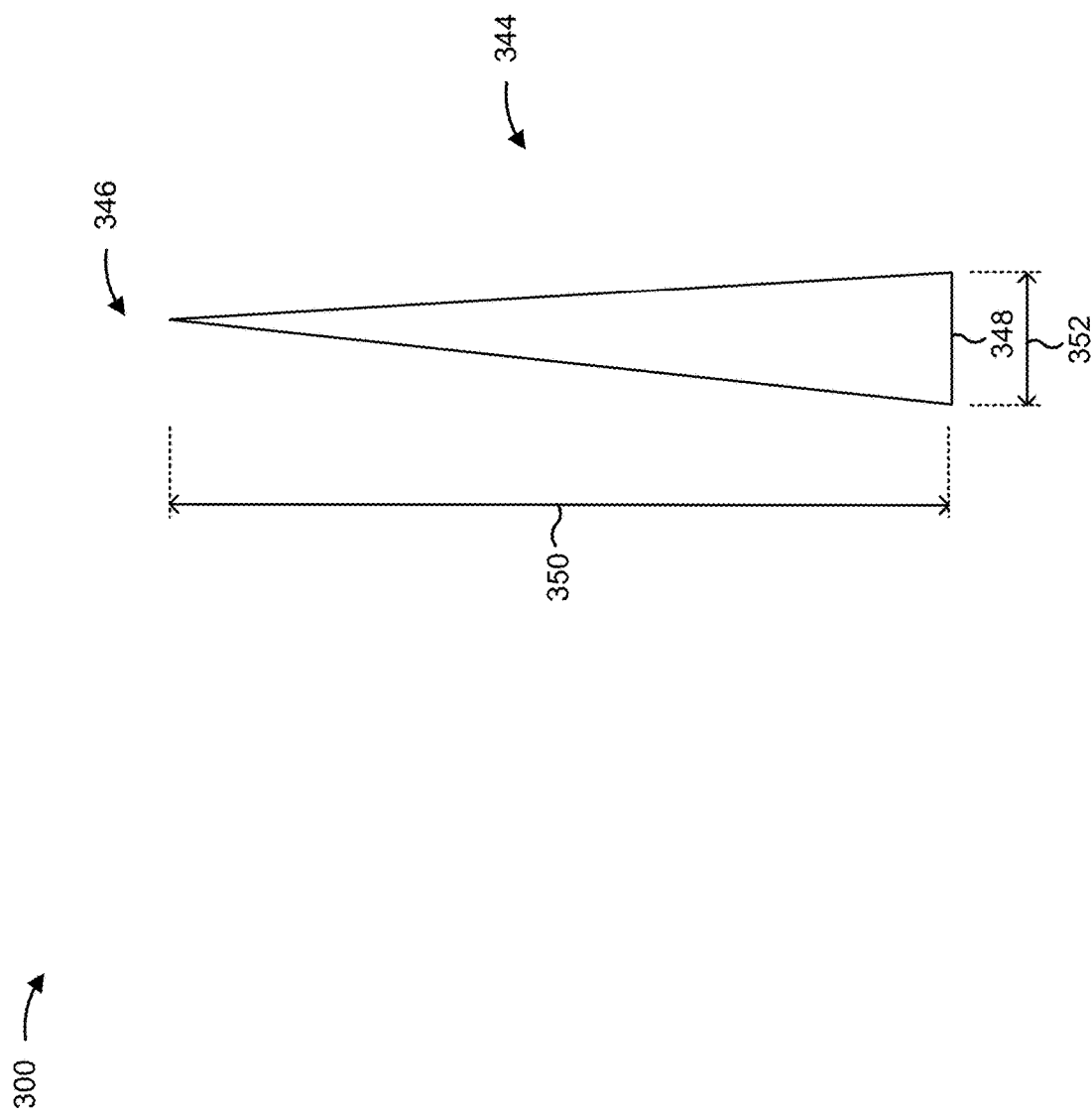

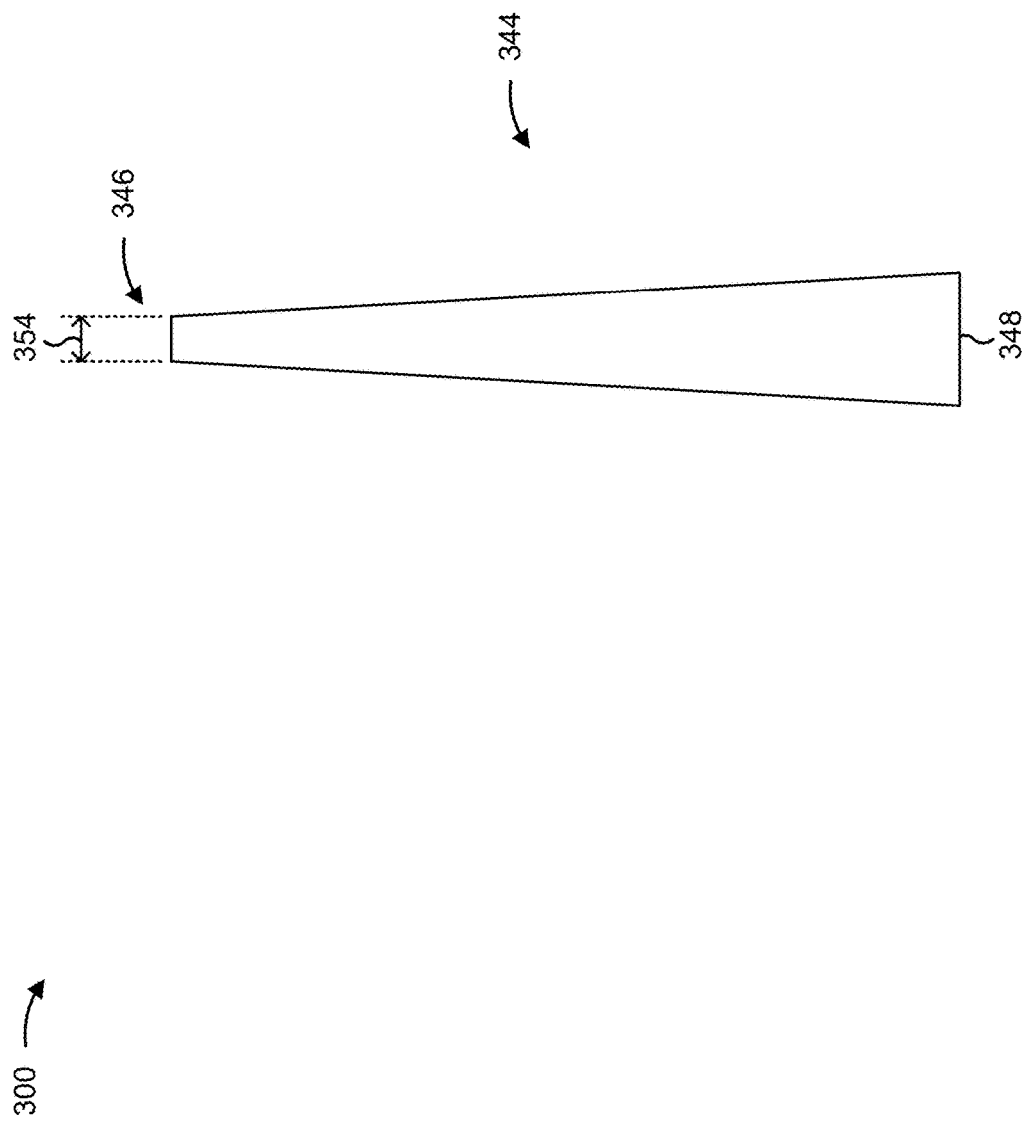

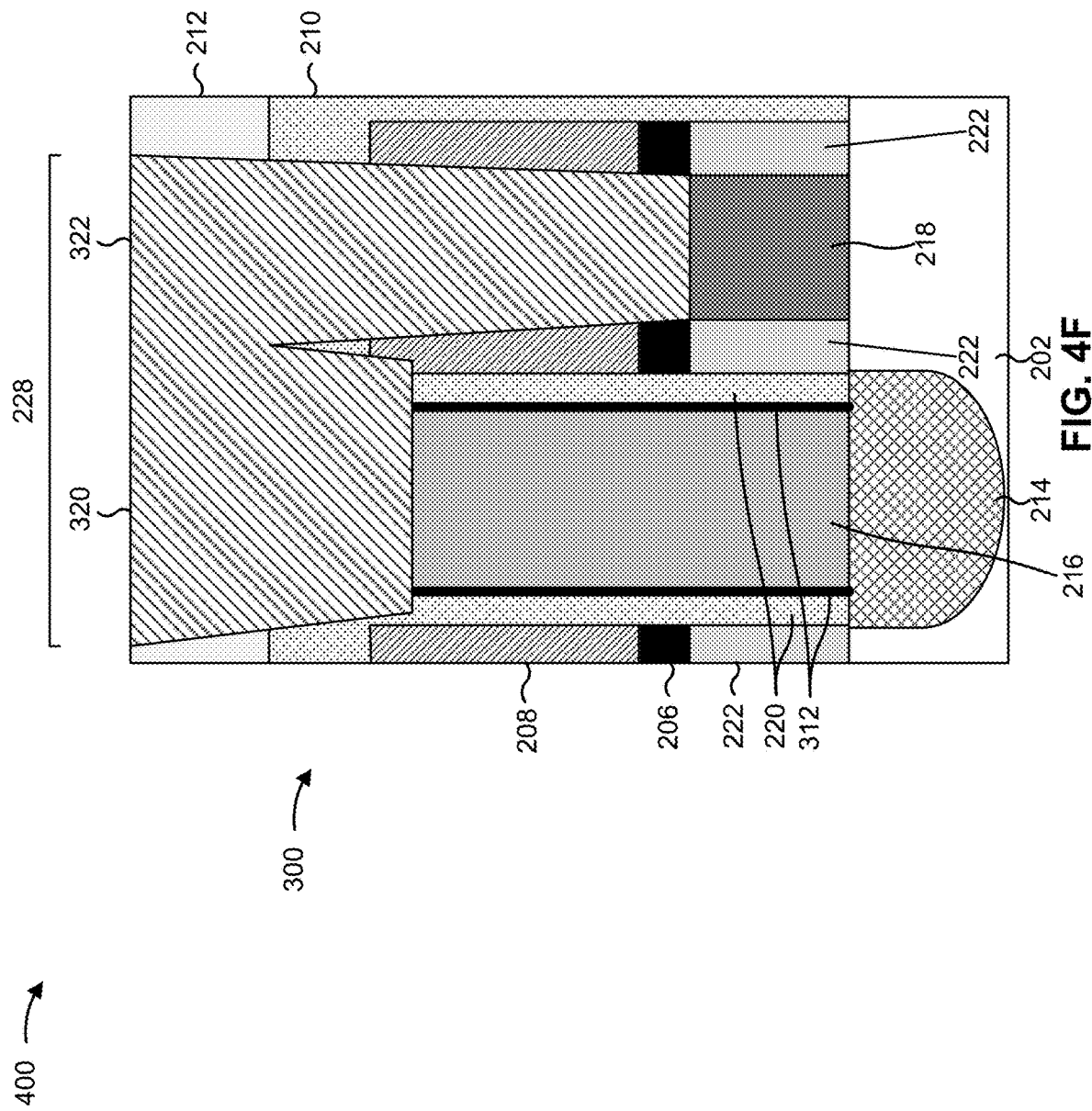

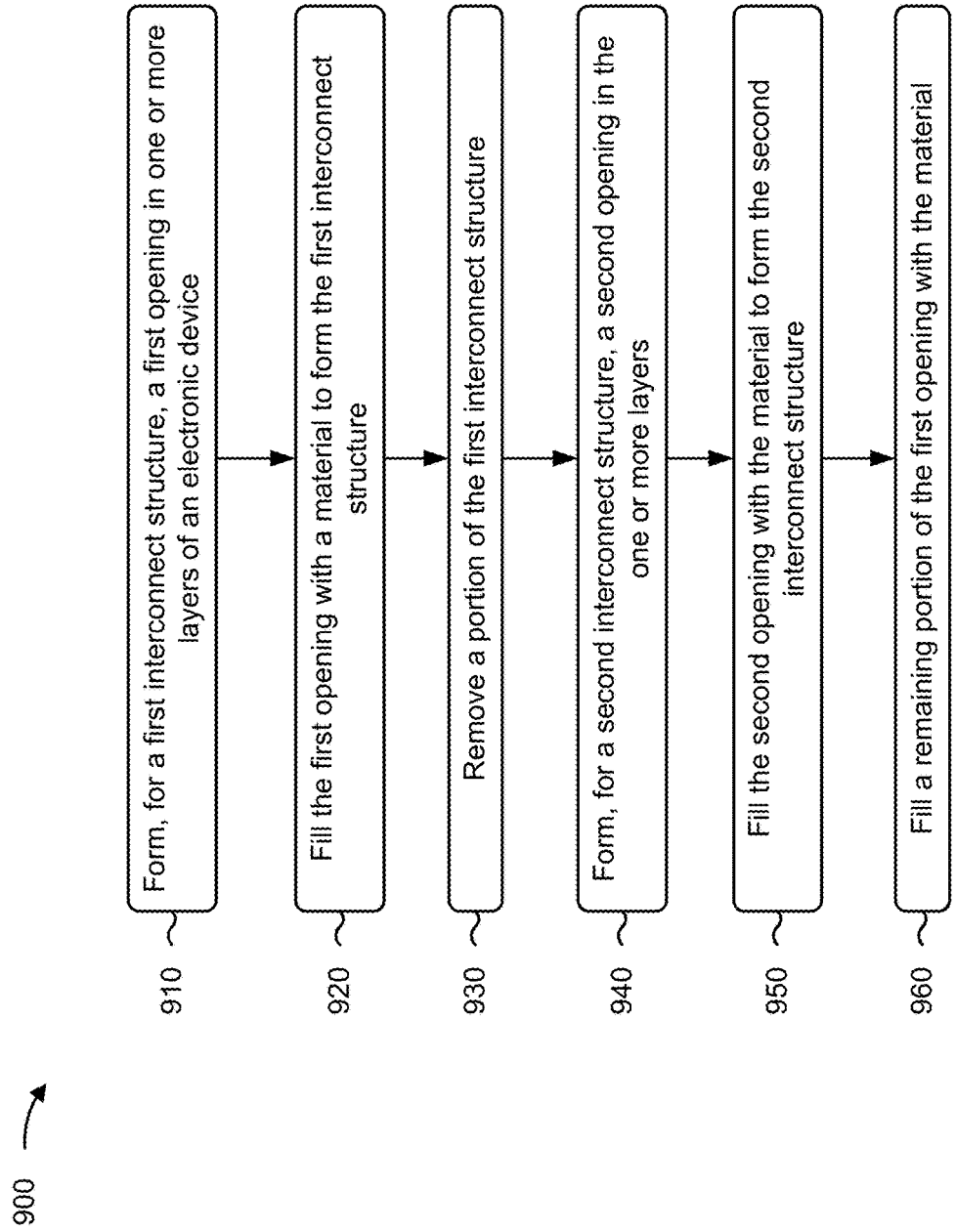

SEMICONDUCTOR DEVICE INTERCONNECTS AND METHODS OF FORMATION

CROSS-REFERENCE TO RELATED APPLICATION

This Patent Application claims priority to U.S. Provisional Patent Application No. 63/200,864, filed on Mar. 31, 2021, and entitled "SEMICONDUCTOR DEVICE INTERCONNECTS AND METHODS OF FORMATION." The disclosure of the prior Application is considered part of and is incorporated by reference into this Patent Application.

BACKGROUND

A semiconductor device (e.g., a processor, a memory) may include various intermediate and backend layers or regions in which individual semiconductor devices (e.g., transistors, capacitors, resistors) are interconnected by interconnect structures. The interconnect structures may include metallization layers (also referred to as wires), vias that connect the metallization layers, contact plugs, and/or trenches, among other examples. A trench and a via may be formed during the same fabrication process referred to as a dual damascene process. In a dual damascene process, a via and a trench are etched using either a via-first procedure or a trench-first procedure. Then, the trench and the via are filled with a conductive material in the same deposition operation (e.g., electroplating).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3E, 4A-4F, and 5A-5E are diagrams of example implementations described herein.

FIG. 9 is a flowchart of an example process relating to forming a semiconductor device described herein.

DETAILED DESCRIPTION

Figure 1:
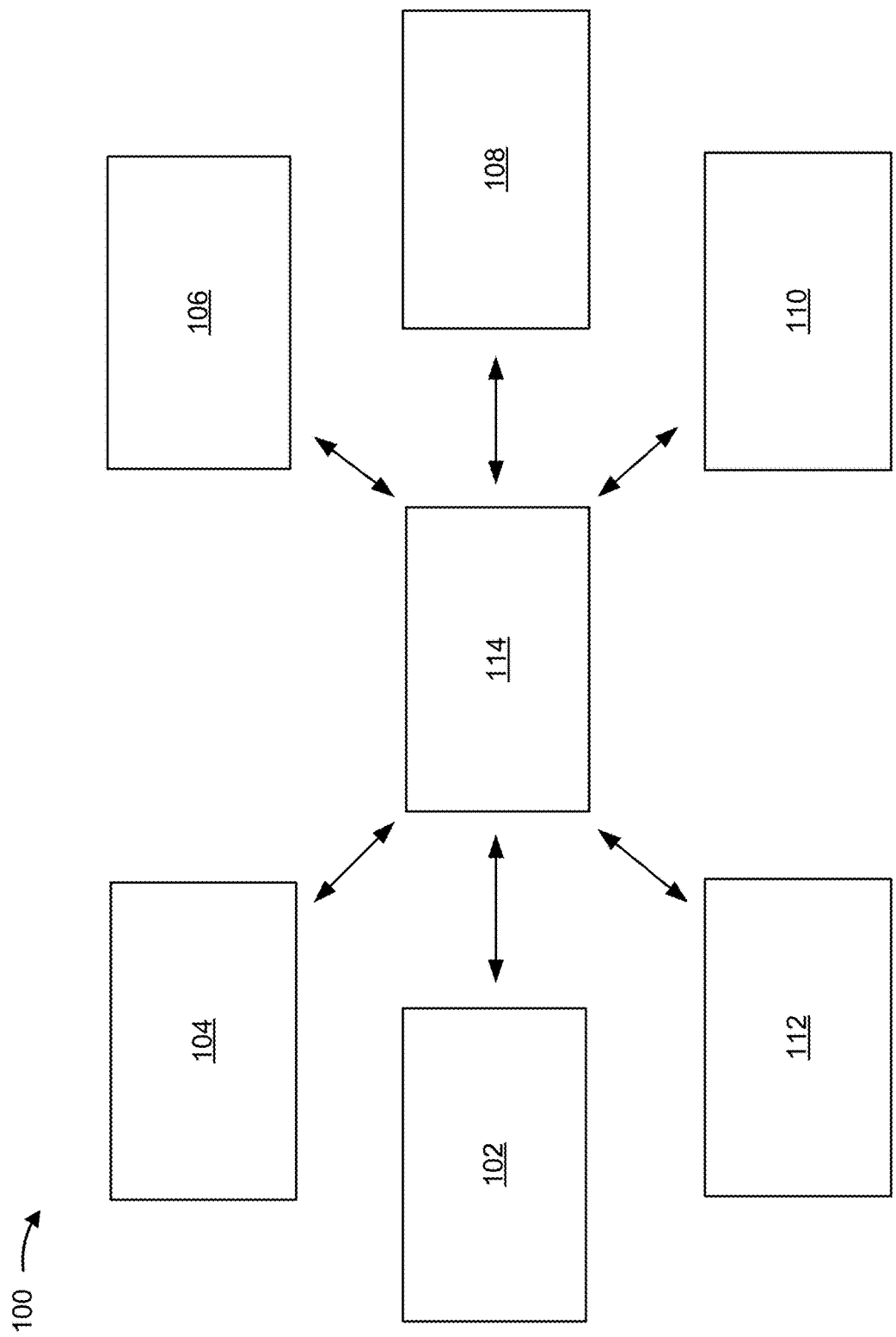
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An interconnect structure may be formed to electrically connect a contact (e.g., a metal gate (MG) or a source/drain contact (MD)) of a semiconductor device to back end of line (BEOL) metallization layers of a semiconductor device in which the contact is included. In some cases, different deposition (or growth) rates of interconnect structures may result in the formation of voids, which can increase contact resistance of the interconnect structures and cause device failures (e.g., open circuits), among other examples. For example, a void may form in a first interconnect structure during filling of the first interconnect structure and an adjoining second interconnect structure (the combination of which may be referred to as a butted contact (BCT)) if the material used to fill the first interconnect structure and the second interconnect structure closes the first interconnect structure before the first interconnect structure can be completely filled. The second interconnect structure may close prior to complete filling of the first interconnect structure for various reasons, such as different growth rates of different types of metals and/or different heights of the first interconnect structure and the second interconnect structure, among other examples.

Some implementations described herein provide techniques for forming a void-free (or near void-free) BCT in a semiconductor device. In some implementations, a first interconnect structure (e.g., a gate interconnect) of the BCT is etched and filled. The first interconnect structure is then etched back such that a portion of the first interconnect structure is removed. The first interconnect structure is etched back to a depth that is near a starting depth of a second interconnect structure (e.g., a source or drain interconnect) of the BCT, then the second interconnect structure and the remaining portion of the first interconnect structure may be filled. In this way, the height of the remaining portion of the first interconnect structure that is to be filled is closer to the height of the second interconnect structure when the second interconnect structure is filled relative to fully filling the second interconnect structure and fully filling the first interconnect structure in a single deposition operation. This reduces the likelihood that filling the second interconnect structure will close the first interconnect structure before the first interconnect structure can be fully filled. This reduces defects in the semiconductor device, decreases the likelihood that defects will be propagated throughout the semiconductor device, reduces contact resistance in the semiconductor device, improves the performance of the semiconductor device, decreases the occurrence of interconnect failures, and/or increases manufacturing yield and quality for the semiconductor device.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is used to transport wafers and/or dies between semiconductor processing tools 102-112 and/or to and from other locations such as a wafer rack, a storage room, and/or the like. In some implementations, wafer/die transport tool 114 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
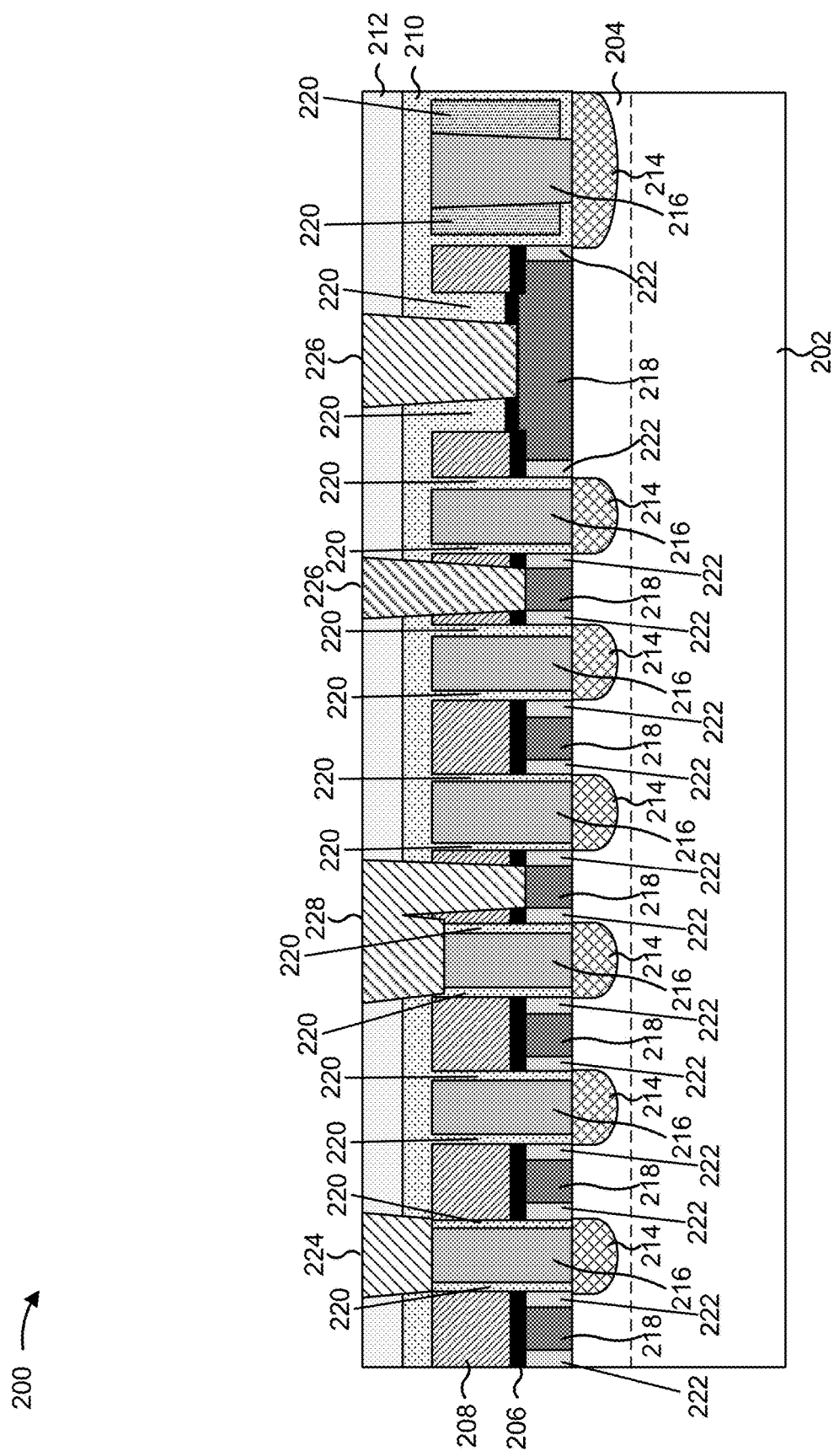
FIG. 2 is a diagram of an example semiconductor device described herein.

FIG. 2 is a diagram of an example semiconductor device 200 described herein. The semiconductor device 200 includes an example of a memory device, a logic device, a processor, an input/output device, or another type of semiconductor device that includes one or more transistors.

As shown in FIG. 2, the semiconductor device 200 includes a substrate 202, which includes a silicon (Si) substrate, a substrate formed of a material including silicon, a III-V compound semiconductor material substrate such as gallium arsenide (GaAs), a silicon on insulator (SOI) substrate, or another type of semiconductor substrate. In some implementations, a fin 204 is formed in the substrate 202. In this way, the transistors included in the semiconductor device 200 include fin field effect transistors (finFETs). In some implementations, the semiconductor device 200 includes other types of transistors, such as gate all around (GAA) transistors, planar transistors, and/or other types of transistors.

The semiconductor device 200 includes one or more stacked layers, including a capping layer 206, a dielectric layer 208, a middle contact etch stop layer (MCESL) 210, and an oxide layer 212, among other examples. The capping layer 206 may be included over the gates of the transistors of the semiconductor device 200 to electrically insulate the gates from other structures of the semiconductor device 200. The dielectric layer 208 includes a silicon nitride ($SiN_x$), an oxide (e.g., a silicon oxide ($SiO_x$) and/or another oxide material), and/or another type of dielectric material. The MCESL (e.g., $SiN_x$ or another suitable material) 210 includes a layer of material that is configured to permit various portions of the semiconductor device 200 (or the layers included therein) to be selectively etched or protected from etching to form one or more of the structures included in the semiconductor device 200. The oxide layer 212 includes a silicon oxide ($SiO_x$) and/or another oxide material that functions as a passivation layer in the semiconductor device 200.

As further shown in FIG. 2, the semiconductor device 200 includes a plurality of epitaxial regions 214 that are grown and/or otherwise formed on and/or around a portion of the fin 204. The epitaxial regions 214 are formed by epitaxial growth. In some implementations, the epitaxial regions 214 are formed in recessed portions in the fin 204. The recessed portions may be formed by etching of the fin 204 and/or another type etching operation. In some implementations, the fin 204 is etched such that the epitaxial regions 214 include strained source/drains.

The epitaxial regions 214 are electrically connected to source/drain contacts 216 of the transistors included in the semiconductor device 200. The source/drain contacts (or MDs) 216 include cobalt (Co) or another conductive or metal material. The transistors further include metal gates 218, which are formed of tungsten (W) or another conductive material. The source/drain contacts 216 and the metal gates 218 are electrically isolated by one or more sidewall spacers and/or barrier layers, including barrier layers 220 in each side of the source/drain contacts 216 and spacers 222 on each side of the metal gates 218. The barrier layers 220 include titanium nitride (TiN), tantalum nitride (TaN), and/or another barrier material. In some implementations, the barrier layers 220 are omitted from the semiconductor device 200. The spacers 222 include a silicon oxide ($SiO_x$), a silicon nitride ($SixN_y$), a silicon oxy carbide (SiOC), a silicon oxycarbonitride (SiOCN), and/or another suitable material.

As further shown in FIG. 2, the source/drain contacts 216 and the metal gates 218 are electrically connected to one or more types of interconnects. The interconnects electrically connect the transistors of the semiconductor device 200 and/or electrically connect the transistors to other areas and/or components of the semiconductor device 200. The source/drain contacts 216 are electrically connected to source or drain interconnects 224. One or more of the metal gates 218 are electrically connected to gate interconnects 226. In some implementations, a source/drain contacts 216 and a metal gate 218 are electrically connected by an interconnect called a butted contact (BCT 228). A butted contact includes a combination of a source or drain contact and a gate contact in a singular structure. The various types of interconnects 224, 226, and 228 include a conductive material such as tungsten, cobalt, ruthenium, copper, and/or another type of conductive material.

As indicated above, FIG. 2 is provided as an example. Other examples may differ from what is described with regard to FIG. 2.

FIGS. 3A-3E are diagrams of an example implementation 300 described herein. The example implementation 300 includes a portion of the semiconductor device 200 that includes a source/drain contact 216, a metal gate 218, and a BCT 228 that electrically connects the source/drain contact 216 and the metal gate 218. The example implementation 300 also includes a plurality of dimensions of the source/drain contact 216, the metal gate 218, the BCT 228, and other structures of the semiconductor device 200 including the dielectric layer 208, the MCESL 210, the oxide layer 212, and the barrier layers 220.

Figure 3A:
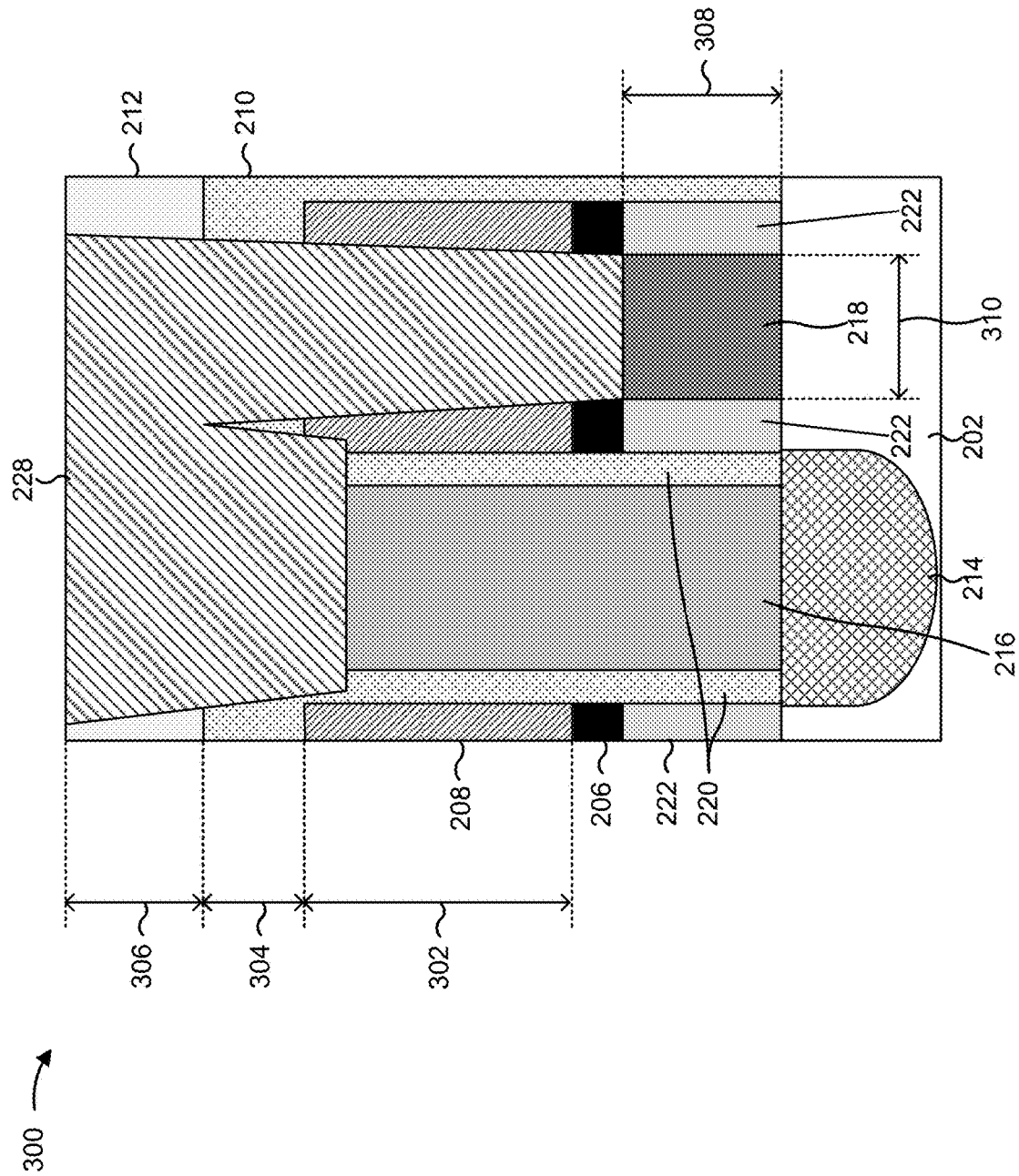

As shown in FIG. 3A, an example dimension 302 of the dielectric layer 208 includes a thickness of the dielectric layer 208. In some implementations, the thickness of the dielectric layer 208 is in a range of approximately 10 nanometers to approximately 25 nanometers to achieve a sufficiently low resistance for the semiconductor device 200 and to reduce and/or minimize a leakage window of the semiconductor device 200. However, other values for the thickness of the dielectric layer 208 are within the scope of the present disclosure.

As further shown in FIG. 3A, an example dimension 304 of the MCESL 210 includes a thickness of the MCESL 210. In some implementations, the thickness of the MCESL 210 is in a range of approximately 3 nanometers to approximately 12 nanometers to provide sufficient etch stop capability and to achieve a sufficiently low resistance for the semiconductor device 200. However, other values for the thickness of the MCESL 210 are within the scope of the present disclosure.

As further shown in FIG. 3A, an example dimension 306 of the oxide layer 212 includes a thickness of the oxide layer 212. In some implementations, the thickness of the oxide layer 212 is in a range of approximately 1 nanometer to approximately 15 nanometers to provide sufficient thickness to accommodate one or more planarization or polishing operations for the semiconductor device 200. However, other values for the thickness of the oxide layer 212 are within the scope of the present disclosure.

As further shown in FIG. 3A, an example dimension 308 of the metal gate 218 includes a height of the metal gate 218. In some implementations, the height of the metal gate 218 is in a range of approximately 5 nanometers to approximately 30 nanometers to provide sufficient etch back loading and to achieve a sufficiently low contact resistance for the metal gate 218. However, other values for the height of the metal gate 218 are within the scope of the present disclosure.

As further shown in FIG. 3A, an example dimension 310 of the metal gate 218 includes a width of the metal gate 218. In some implementations, the width of the metal gate 218 is in a range of approximately 9 nanometers to approximately 100 nanometers to achieve a sufficiently low contact resistance for the metal gate 218. However, other values for the width of the metal gate 218 are within the scope of the present disclosure.

Figure 3B:
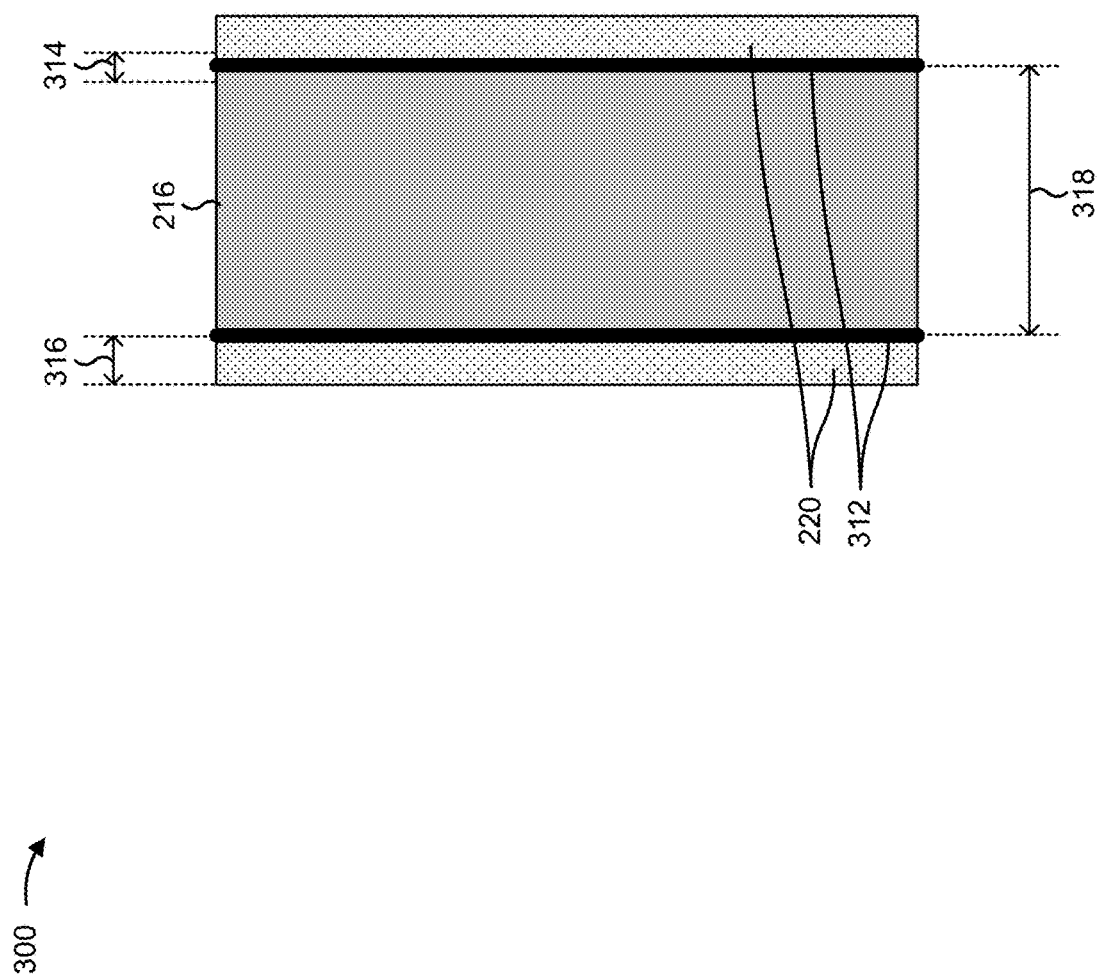

As shown in FIG. 3B, in some implementations, a liner 312 is included on the sidewalls of the source/drain contact 216 between the source/drain contact 216 and the barrier layers 220. The liner 312 may be included to promote adhesion between the source/drain contact 216 and the barrier layers 220, to protect against diffusion between the source/drain contact 216 and the barrier layers 220, and/or for another purpose. The liner 312 includes titanium (Ti), a titanium nitride (TiN$_x$), and/or another suitable material. An example dimension 314 of the liner 312 includes a thickness of the liner 312. In some implementations, the thickness of the liner 312 is in a range of approximately 5 angstroms to approximately 50 angstroms to provide a sufficient adhesion layer and to minimize gaps or discontinuities in the liner 312 while maintaining a sufficiently low resistance for the source/drain contact 216. However, other values for the thickness of the liner 312 are within the scope of the present disclosure.

As further shown in FIG. 3B, an example dimension 316 of the barrier layers 220 includes a thickness of the barrier layers 220. In some implementations, the thickness of the barrier layers 220 is in a range of approximately 1 nanometer to approximately 12 nanometer to achieve sufficiently low leakage for the source/drain contact 216 while achieving a sufficiently low resistance for the source/drain contact 216. However, other values for the thickness of the barrier layers 220 are within the scope of the present disclosure.

As further shown in FIG. 3B, an example dimension 318 of the source/drain contact 216 includes a width of the source/drain contact 216. In some implementations, the width of the source/drain contact 216 is in a range of approximately 14 nanometers to approximately 40 nanometers to achieve a sufficiently low contact resistance for the source/drain contact 216. However, other values for the width of the source/drain contact 216 are within the scope of the present disclosure.

Figure 3C:
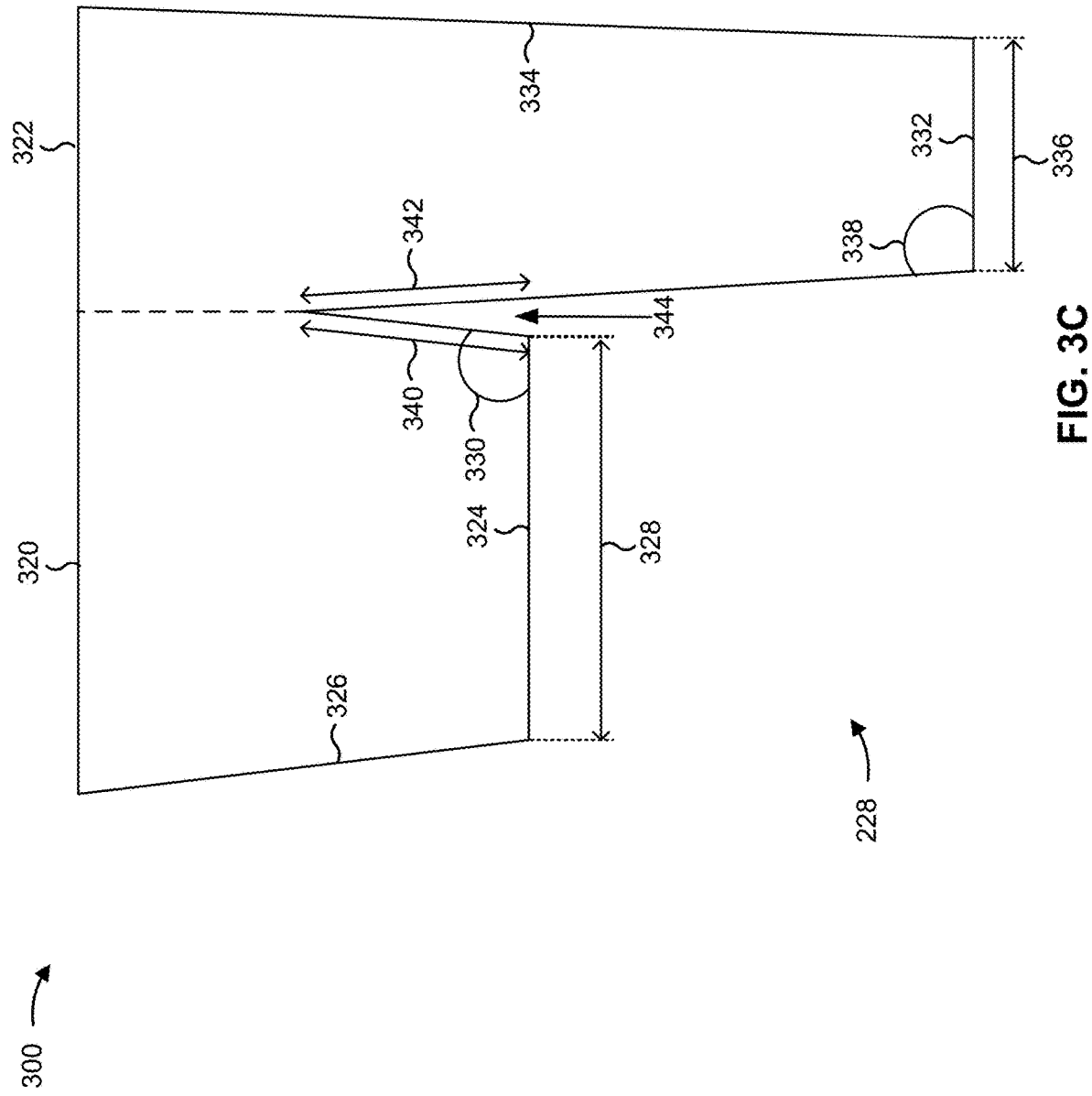

As shown in FIG. 3C, a portion of the BCT 228 may be referred to as a first interconnect structure 320 (e.g., a source or drain interconnect, which may be referred to as a VD). Another portion of the BCT 228 may be referred to as a second interconnect structure 322 (e.g., a gate interconnect, which may be referred to as a VG). The first interconnect structure 320 and the second interconnect structure 322 are physically and electrically connected along a portion of the first interconnect structure 320 and a portion of the second interconnect structure 322 to form a single interconnect (e.g., the BCT 228) that electrically connects the source/drain contact 216 and the metal gate 218.

As further shown in FIG. 3C, the first interconnect structure 320 includes a bottom surface 324 and a plurality of sidewalls 326. An example dimension 328 of the bottom surface 324 includes a width of the bottom surface 324. In some implementations, the width of the bottom surface 324 is in a range of approximately 14 nanometers to approximately 30 nanometers to achieve a sufficiently low contact resistance for the source/drain contact 216 and to fully cover the top surface of the source/drain contact 216. However, other values for the width of the bottom surface 324 are within the scope of the present disclosure.

An example dimension 330 of the first interconnect structure 320 includes an angle between the bottom surface 324 and a sidewall 326 of the first interconnect structure 320. The example dimension 330 may also be referred to as a profile of the first interconnect structure 320. In some implementations, the angle is in a range of greater than 90 degrees and to approximately 95 degrees so that the sidewall 326 is tapered or angled toward the second interconnect structure 322, from the bottom surface 324 to a top surface of the first interconnect structure 320, to enable the first interconnect structure 320 to physically and electrically connect with the second interconnect structure 322. However, other values for the angle are within the scope of the present disclosure.

As further shown in FIG. 3C, the second interconnect structure 322 includes a bottom surface 332 and a plurality of sidewalls 334. An example dimension 336 of the bottom surface 332 includes a width of the bottom surface 332. In some implementations, the width of the bottom surface 332 is in a range of greater than approximately 8 nanometers to approximately 18 nanometers to achieve a sufficiently low contact resistance for the metal gate 218 and to fully cover the top surface of the metal gate 218. However, other values for the width of the bottom surface 332 are within the scope of the present disclosure.

An example dimension 338 of the second interconnect structure 322 includes an angle between the bottom surface 332 and a sidewall 334 of the second interconnect structure 322. The example dimension 338 may also be referred to as a profile of the second interconnect structure 322. In some implementations, the angle is in a range of greater than 90 degrees and to approximately 95 degrees so that the sidewall 334 is tapered or angled toward the first interconnect structure 320, from the bottom surface 332 to a top surface of the second interconnect structure 322, to enable the second interconnect structure 322 to physically and electrically connect with the first interconnect structure 320. However, other values for the angle are within the scope of the present disclosure.

As described above, the sidewalls 326 of the first interconnect structure 320 are tapered or angled at an angle (e.g., the dimension 330), and the sidewalls 334 of the second interconnect structure 322 are angled at an angle (e.g., the dimension 338). A sidewall 326, adjacent to the second interconnect structure 322, is angled or tapered away from the second interconnect structure 322 from the top surface of the first interconnect structure 320 to the bottom surface 324. Similarly, a sidewall 334, adjacent to the first interconnect structure 320, is angled or tapered away from the first interconnect structure 320 from the top surface of the second interconnect structure 322 to the bottom surface 332. The diverging angles of the adjacent or abutting sidewalls 326 and 334 results in a portion 340 of the sidewall 326 and another portion 342 of the sidewall 334 being separated or spaced apart by a gap 344. In this way, the first interconnect structure 320 and the second interconnect structure 322 are non-contiguous along the portion 340 of the sidewall 326 and the portion 342 of the sidewall 334.

FIG. 3D illustrates an example implementation of the gap 344 in which the gap 344 includes an approximately triangle-shaped gap. As shown in FIG. 3D, the gap 344 includes a top 346 and a bottom 348. The top 346 of the gap 344 is located near where the first interconnect structure 320 and the second interconnect structure 322 converge and physically connect. As further shown in FIG. 3D, an example dimension 350 of the gap 344 includes a height of the gap 344. In some implementations, the height of the gap 344 is in a range of approximately 1 nanometer to approximately 20 nanometers to permit the first interconnect structure 320 and the second interconnect structure 322 to electrically and physically connect. However, other values for the height of the gap 344 are within the scope of the present disclosure. Another example dimension 352 of the gap 344 includes a width of the bottom 348 of the gap 344. In some implementations, the width of the bottom 348 of the gap 344 is in a range of approximately 1 angstrom to approximately 50 angstroms to permit the first interconnect structure 320 and the second interconnect structure 322 to electrically and physically connect and to achieve a sufficiently low resistance for the BCT 228. However, other values for the width of the bottom 348 of the gap 344 are within the scope of the present disclosure.

FIG. 3E illustrates an example implementation of the gap 344 in which the gap 344 includes a trapezoid-shaped gap in which the top 346 of the gap 344 is substantially flat. Moreover, other shapes for the gap 344 are within the scope of the present disclosure. An example dimension 354 of the gap 344 includes a width of the top 346 of the gap 344. The width of the top 346 of the gap 344 is less than the width of the bottom 348 of the gap 344 to permit the sidewalls of the first interconnect structure and the second interconnect structure to be angled away and to permit the first interconnect structure and the second interconnect structure to electrically and physically connect along a portion of the first interconnect structure and the second interconnect structure. In some implementations, a ratio between the width of the bottom 348 of the gap 344 and the width of the top 346 of the gap 344 is in a range of approximately 1:1 approximately 50:1 to permit the sidewalls of the first interconnect structure and the second interconnect structure to be angled away and to permit the first interconnect structure and the second interconnect structure to electrically and physically connect along a portion of the first interconnect structure and the second interconnect structure. However, other values for the ratio are within the scope of the present disclosure.

As indicated above, FIGS. 3A-3E are provided as examples. Other examples may differ from what is described with regard to FIGS. 3A-3E.

Figure 4A:
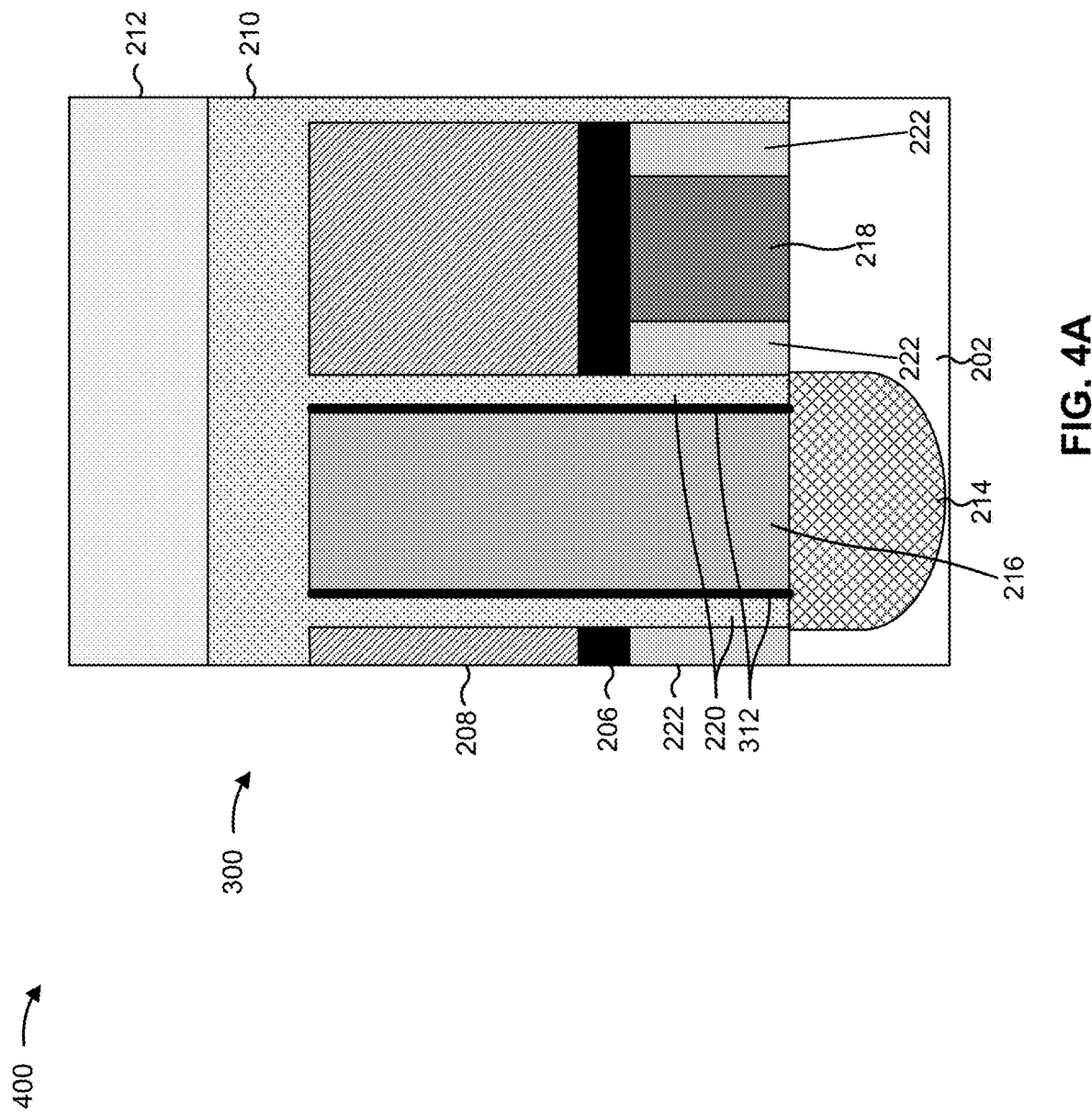

FIGS. 4A-4F are diagrams of an example implementation 400 described herein. The example implementation 400 includes an example void-free (or near void-free) technique for forming a BCT 228 described herein. Turning to FIG. 4A, the example void-free (or near void-free) technique for forming a BCT 228 may be performed in connection with a source/drain contact 216 and a metal gate 218 included in the semiconductor device 200. In particular, the example void-free (or near void-free) technique for forming a BCT 228 may be performed to electrically connect the source/drain contact 216 and the metal gate 218.

Figure 4B:
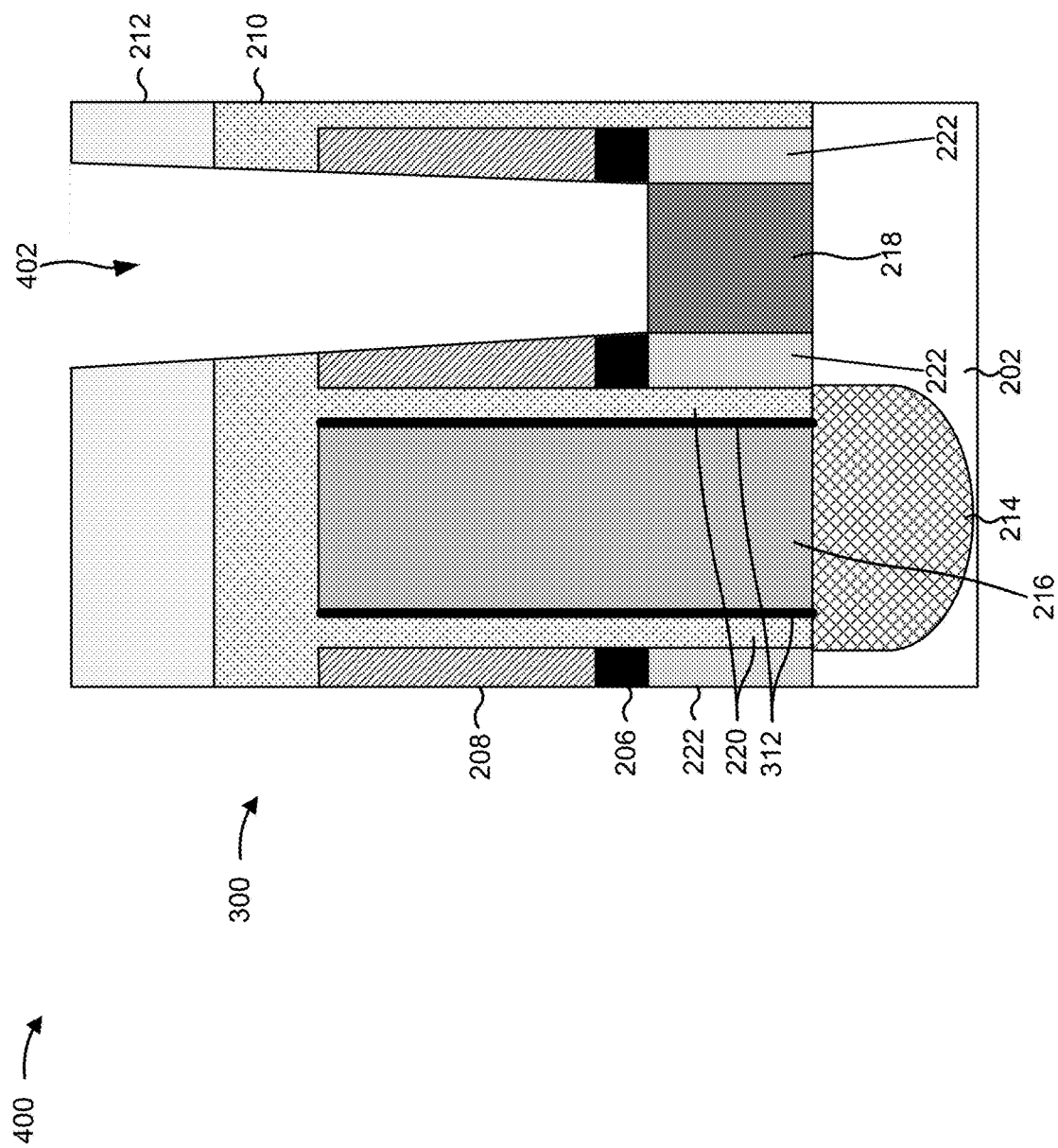

As shown in FIG. 4B, an opening 402 is formed into and through one or more layers of the semiconductor device 200. In particular, the opening 402 is formed through the oxide layer 212, the MCESL 210, the dielectric layer 208, and the capping layer 206. In this way, the opening 402 is formed through the one or more layers to the metal gate 218 to expose the top of the metal gate 218.

In some implementations, a pattern in a photoresist layer is used to form the opening 402. In these implementations, the deposition tool 102 forms the photoresist layer on the oxide layer 212. The exposure tool 104 exposes the photoresist layer to a radiation source to pattern the photoresist layer. The developer tool 106 develops and removes portions of the photoresist layer to expose the pattern. The etch tool 108 etches through the oxide layer 212, the MCESL 210, the dielectric layer 208, and the capping layer 206 to form the opening 402. In some implementations, the etch operation includes a plasma etch technique, a wet chemical etch technique, and/or another type of etch technique. The etch tool 108 may form the opening 402 using one or more etching operations. In some implementations, a photoresist removal tool removes the remaining portions of the photoresist layer (e.g., using a chemical stripper, plasma ashing, and/or another technique). In some implementations, a hard mask layer is used as an alternative technique for forming the opening 402 based on a pattern.

Figure 4C:
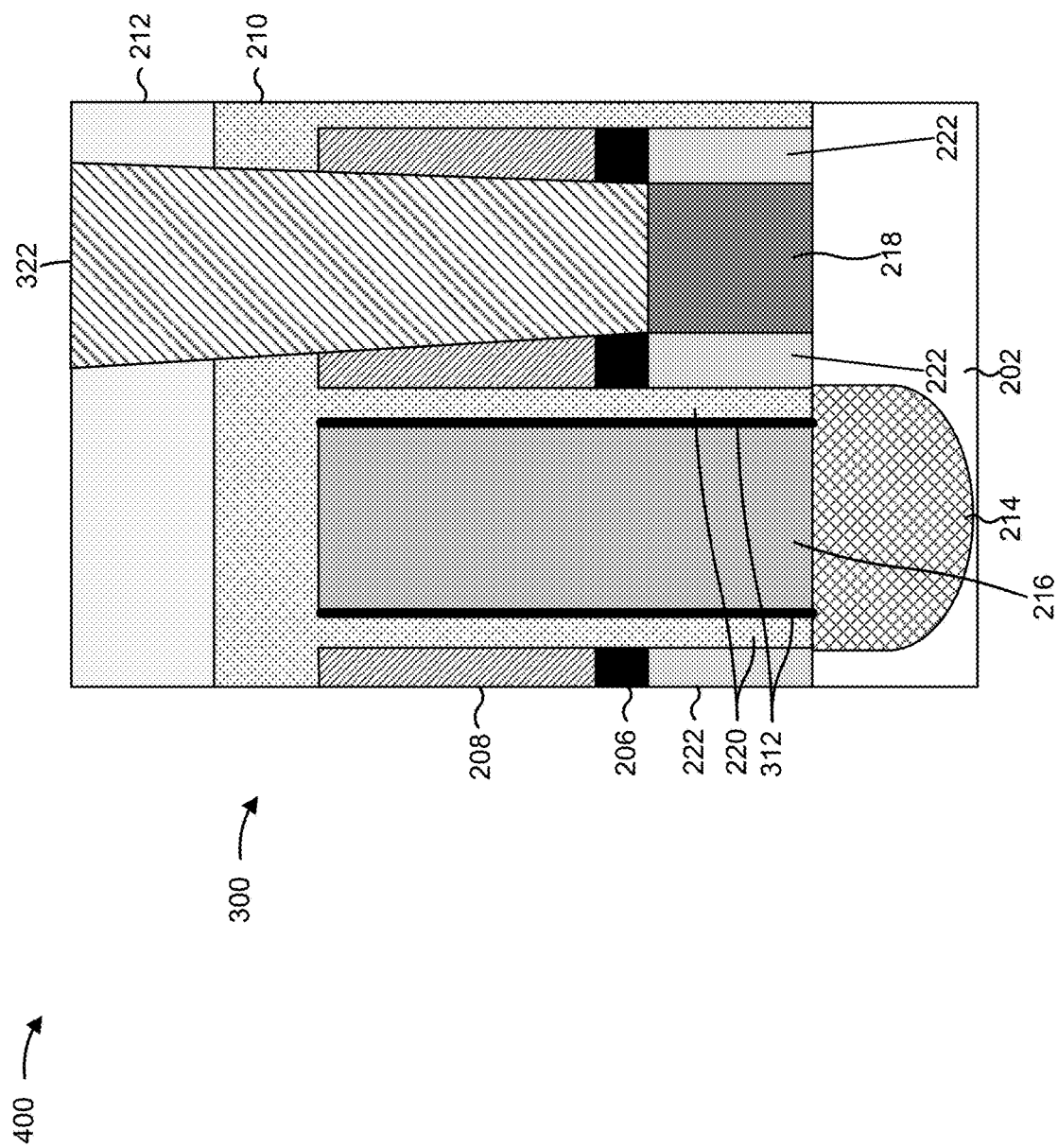

As shown in FIG. 4C, the opening 402 is filled with a material (e.g., tungsten (W), Cobalt, Ruthenium, and/or another metal or conductive material or a combination of more than one material/metal) to form the second interconnect structure 322 as part of a deposition operation. The deposition tool 102 and/or the plating tool 112 deposits the material (e.g., by CVD, ALD, electroplating, and/or another deposition technique) using a bottom-up selective growth technique, in which the material is deposited over and/or on the metal gate 218 in the opening 402 such that the height of the second interconnect structure 322 continues to grow during the deposition operation. In other words, the material does not grow on the insulating sidewalls of the opening 402 and instead grows on the metal gate 218. The material is deposited into the opening 402 to fill the opening 402 up to (or near) the top of the oxide layer 212. In some implementations, the planarization tool 110 planarizes or polishes the second interconnect structure 322 after deposition of the material to form the second interconnect structure 322.

Figure 4D:
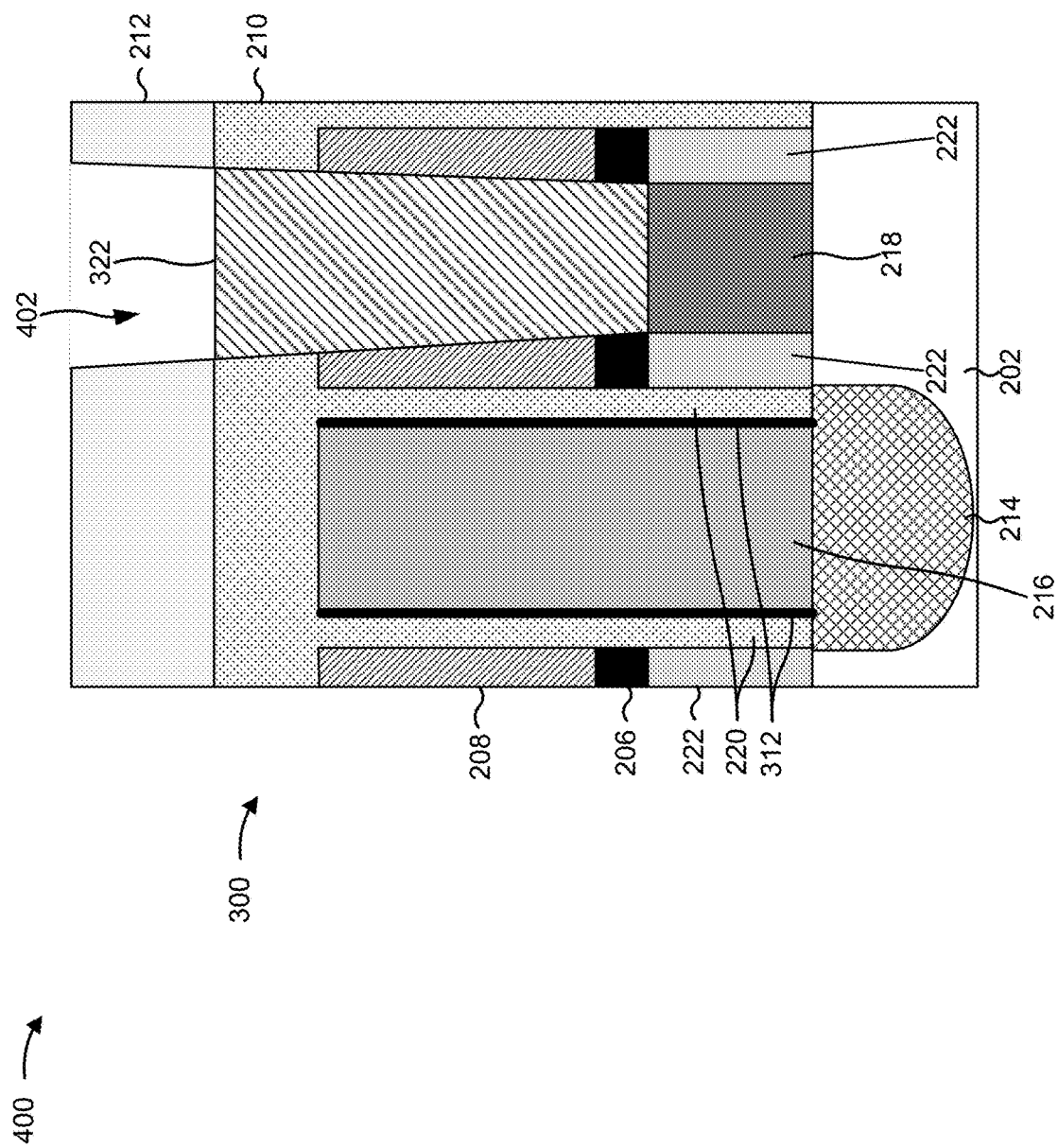

As shown in FIG. 4D, a first etch operation is performed to remove a portion of the second interconnect structure 322 in the opening 402. The second interconnect structure 322 is etched back to at or near the top surface of the MCESL 210. Accordingly, the amount of material that is removed from the second interconnect structure 322 is approximately equal to the thickness of the oxide layer 212. As an example, the amount of material that is removed from the second interconnect structure 322 is in a range of approximately 1 nanometer to approximately 15 nanometers such that the height of the second interconnect structure 322 is approximately equal to the top surface of the MCESL 210, and such that a sufficient amount of the material is removed to minimize the likelihood of void formation in the first interconnect structure 320 and the second interconnect structure 322. However, other values for the amount of material that is removed from the second interconnect structure 322 is within the scope of the present disclosure.

In some implementations, a pattern in a photoresist layer is used to remove the portion of the second interconnect structure 322. In these implementations, the deposition tool 102 forms the photoresist layer on the oxide layer 212 and on the second interconnect structure 322. The exposure tool 104 exposes the photoresist layer to a radiation source to pattern the photoresist layer. The developer tool 106 develops and removes portions of the photoresist layer to expose the pattern. The etch tool 108 etches the second interconnect structure 322 to remove the portion of the second interconnect structure 322. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique etching the second interconnect structure 322 based on a pattern.

Figure 4E:
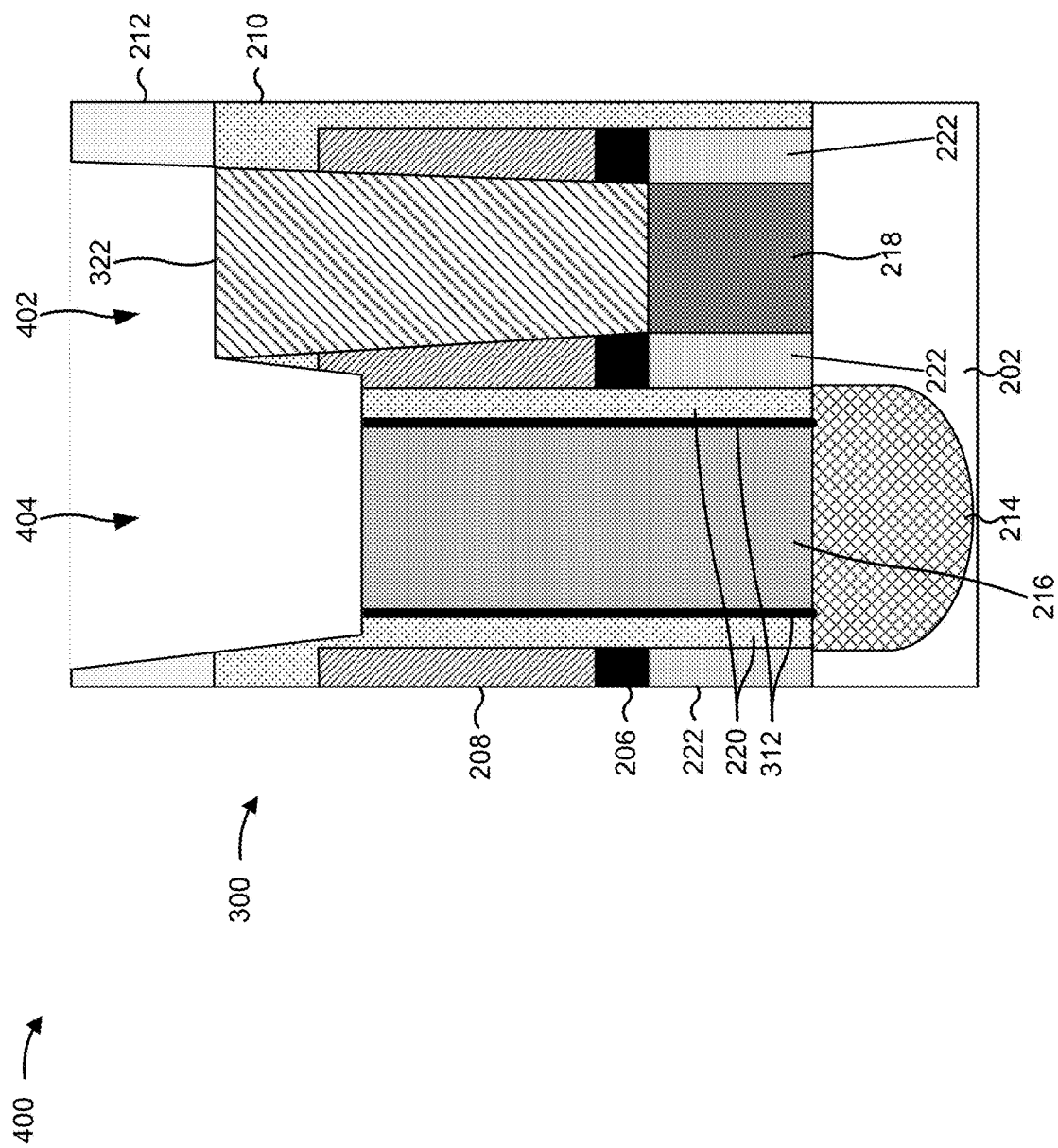

As shown in FIG. 4E, a second etch operation (subsequent to the first etch operation) is performed to form a second opening 404 to the source/drain contact 216. In particular, the opening 404 is formed through the oxide layer 212, the MCESL 210, and into a portion of the dielectric layer 208. In this way, the opening 404 is formed through one or more layers of the semiconductor device 200 to the source/drain contact 216 to expose the top of the source/drain contact 216.

In some implementations, a pattern in a photoresist layer is used to form the opening 404. In these implementations, the deposition tool 102 forms the photoresist layer on the oxide layer 212. The exposure tool 104 exposes the photoresist layer to a radiation source to pattern the photoresist layer. The developer tool 106 develops and removes portions of the photoresist layer to expose the pattern. The etch tool 108 etches through the oxide layer 212, the MCESL 210, and into the dielectric layer 208 to form the opening 404. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the opening 404 based on a pattern.

As further shown in FIG. 4E, the opening 402 is formed such that the opening 402 and the opening 402 are continuous and connected along a portion of the sidewalls of the opening 402 and the opening 404. This enables the second interconnect structure 322 to be connected with the first interconnect structure 320 that is to be formed in the opening 404 along a portion of the sidewalls of the first interconnect structure 320 and the second interconnect structure 322 (e.g., a portion of the sidewalls 326 and 334).

As shown in FIG. 4F, the opening 404 and the unfilled portion of the opening 402 (e.g., resulting from etching back the second interconnect structure 322) are filled with the material (e.g., tungsten (W) and/or another metal or conductive material) to form the first interconnect structure 320 and to fully fill the second interconnect structure 322 as part of a deposition operation. The formation of the first interconnect structure 320 and filling the second interconnect structure 322 results in the formation of the BCT 228. Etching back the second interconnect structure 322 (e.g., to at or near the MCESL 210, or to another depth) enables the deposition operation to fill the first interconnect structure 320 and the remaining portion of the second interconnect structure 322 to start at or near similar depths. In this way, the likelihood that the first interconnect structure 320 will be completed first and close the second interconnect structure 322 before the second interconnect structure 322 can be fully formed (which might otherwise result in the formation of a void in the second interconnect structure 322) is reduced and/or minimized.

The deposition tool 102 and/or the plating tool 112 deposits (e.g., by CVD, ALD, electroplating, and/or another deposition technique) the material in the openings 402 and 404 using a bottom-up selective growth technique, in which the material is deposited over and/or on the second interconnect structure in the opening 402 and over and/or on the source/drain contact 216 in the opening 404. In this way, the height of first interconnect structure 320 and the height of the second interconnect structure 322 continues to grow during the deposition operation. The first interconnect structure 320 and the second interconnect structure 322 are connected to form the BCT 228 along the portion of the sidewalls of the opening 402 and the opening 404 in which the opening 402 and the opening 404 are continuous and connected. In some implementations, the planarization tool 110 planarizes or polishes the BCT 228 after deposition of the material.

As further shown in FIG. 4F, the first interconnect structure 320 and the second interconnect structure 322 are discontinuous or spaced apart by the gap 344 along respective portions of the sidewalls 326 and 334 (e.g., the portion 340 and 342). The gap 344 results from the respective profiles or shapes of the openings 402 and 404. In particular, the sidewalls of the openings 402 and 404 (and thus, the sidewalls 326 and 334 of the first interconnect structure 320 and the second interconnect structure 322, respectively) are angled at opposing angles such that the size of the gap 344 increases from the top 346 of the gap 344 to the bottom 348 of the gap 344. In some implementations, the opening 404 is formed such that the gap 344 is triangle shaped, trapezoid shaped, or such that the gap 344 is formed to another shape. In some implementations, the opening 402 and/or 404 are formed such that the gap 344 conforms to one or more of the dimension ranges described above in connection with FIGS. 3A-3E. In some implementations, the opening 402 and/or 404 are formed such that the gap 344 conforms to one or more other dimension ranges.

As indicated above, FIGS. 4A-4F are provided as examples. Other examples may differ from what is described with regard to FIGS. 4A-4F.

FIGS. 5A-5E are diagrams of an example implementation described herein. The example implementation 500 includes an example void-free (or near void-free) technique for forming a BCT 228 described herein. The example implementation 500 includes a technique that is similar to the void-free (or near void-free) technique for forming a BCT 228 of the example implementation 400 described above in connection with FIGS. 4A-4F. However, in the example implementation 500, the first etch operation to etch back the second interconnect structure 322 to remove the portion of the second interconnect structure 322, and the second etch operation to form the opening 404 to the source/drain contact 216, are combined into a single etch operation. This reduces the number of process steps and the complexity of forming the BCT 228 in a void-free (or near-void free) manner.

Figure 5A:
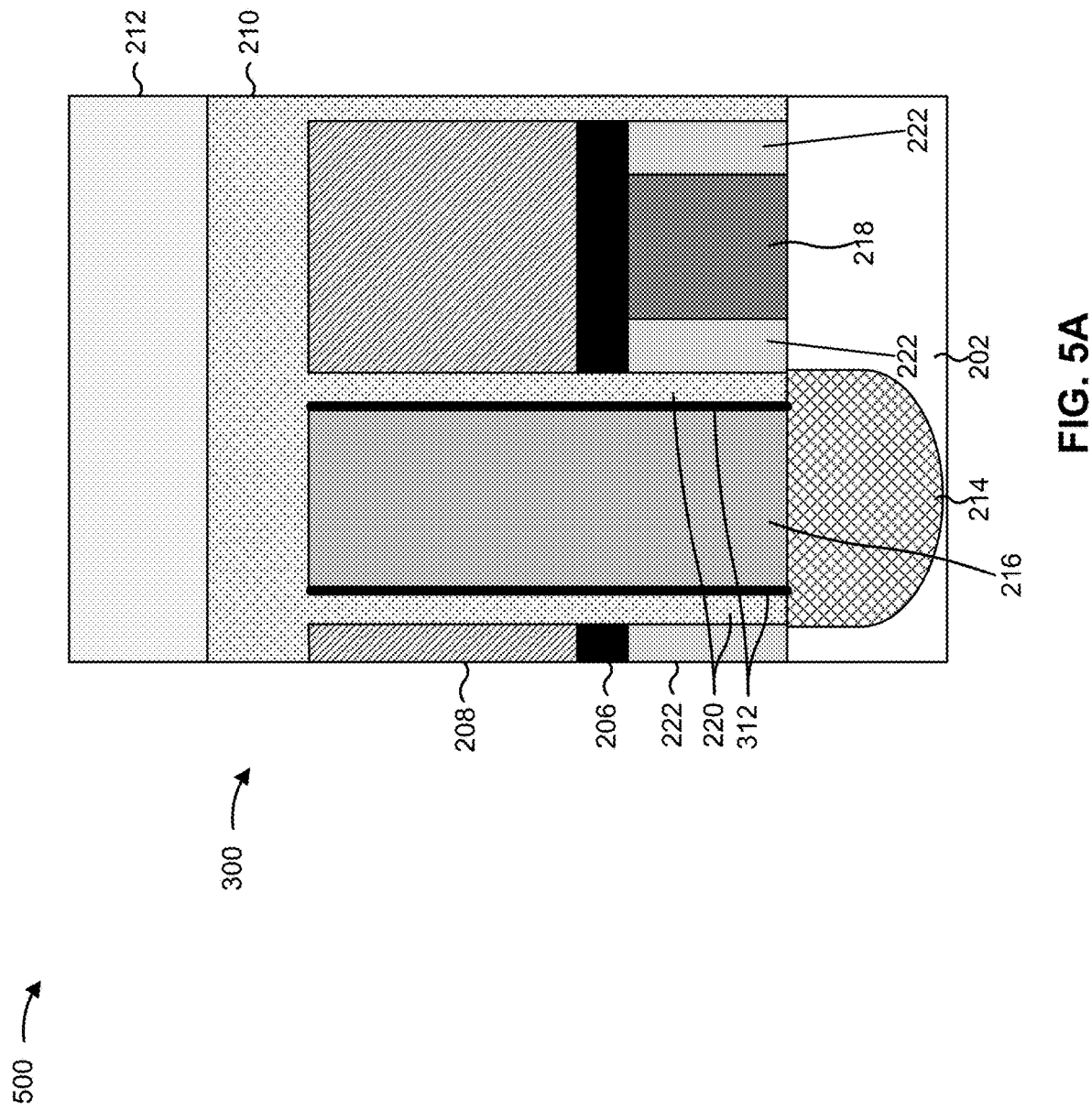

Turning to FIG. 5A, the example void-free (or near void-free) technique for forming a BCT 228 of the example implementation 500 may be performed in connection with a source/drain contact 216 and a metal gate 218 included in the semiconductor device 200. In particular, the example void-free (or near void-free) technique for forming a BCT 228 may be performed to electrically connect the source/drain contact 216 and the metal gate 218.

Figure 5B:
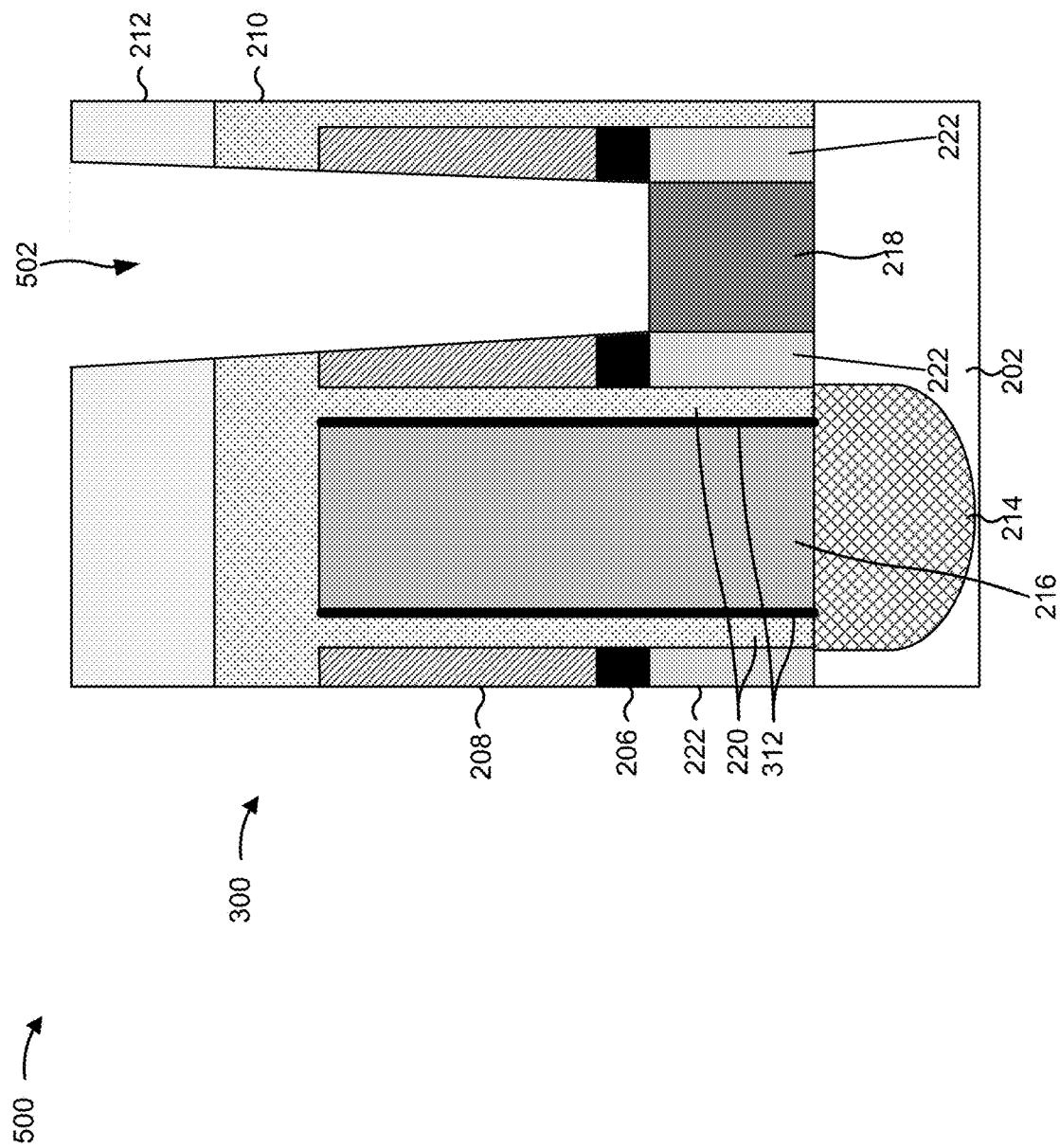

As shown in FIG. 5B, an opening 502 is formed into and through one or more layers of the semiconductor device 200. In particular, the opening 502 is formed through the oxide layer 212, the MCESL 210, the dielectric layer 208, and the capping layer 206. In this way, the opening 502 is formed through the one or more layers to the metal gate 218 to expose the top of the metal gate 218.

In some implementations, a pattern in a photoresist layer is used to form the opening 502. In these implementations, the deposition tool 102 forms the photoresist layer on the oxide layer 212. The exposure tool 104 exposes the photoresist layer to a radiation source to pattern the photoresist layer. The developer tool 106 develops and removes portions of the photoresist layer to expose the pattern. The etch tool 108 etches through the oxide layer 212, the MCESL 210, the dielectric layer 208, and the capping layer 206 to form the opening 502. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique).

In some implementations, a hard mask layer is used as an alternative technique for forming the opening 502 based on a pattern.

Figure 5C:
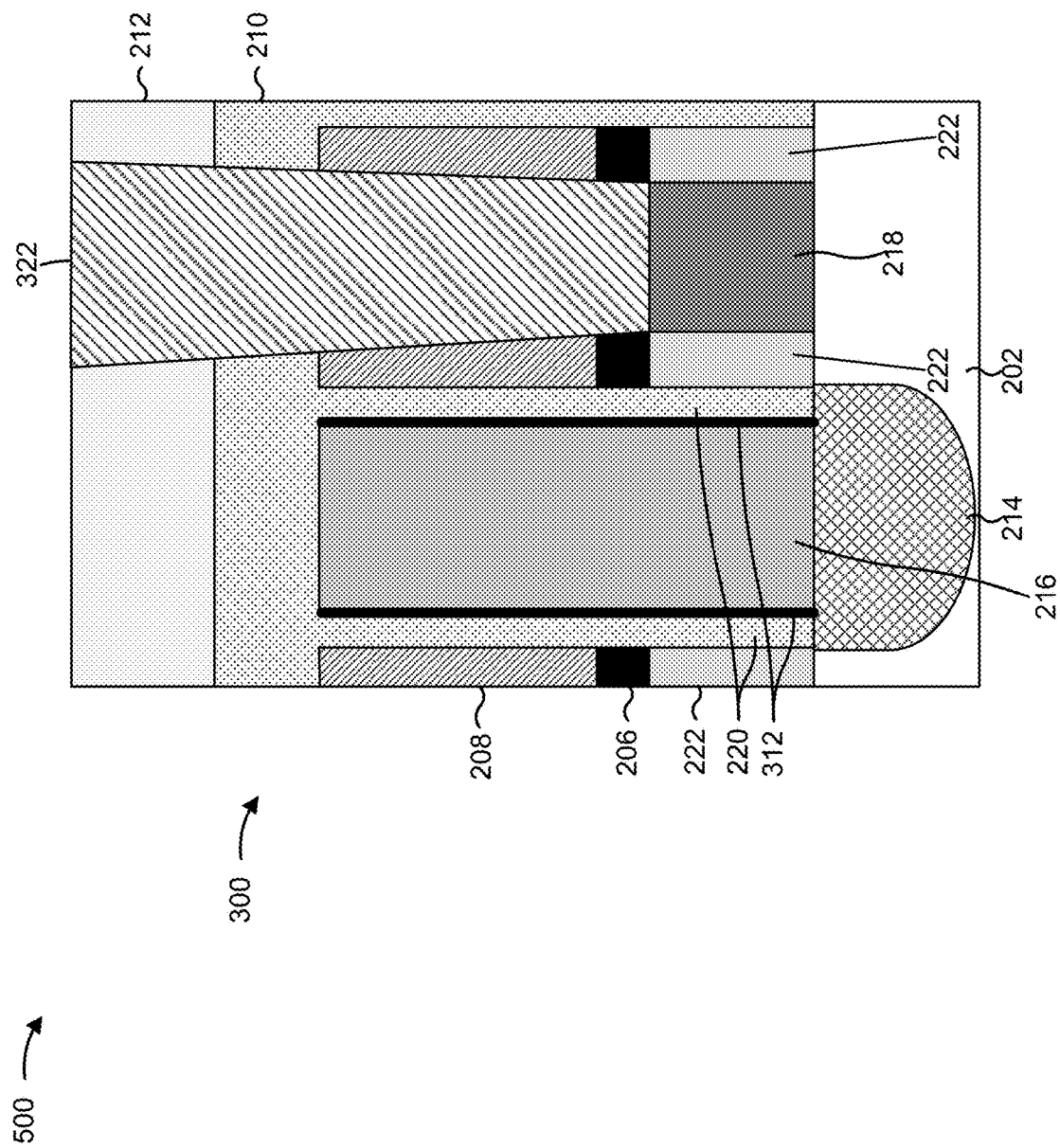

As shown in FIG. 5C, the opening 502 is filled with a material (e.g., tungsten (W), Cobalt, Ru, and/or another metal or conductive material or a combination of more than one material/metal) to form the second interconnect structure 322 as part of a deposition operation. The deposition tool 102 and/or the plating tool 112 deposits the material (e.g., by CVD, ALD, electroplating, and/or another deposition technique) using a bottom-up selective growth technique, in which the material is deposited over and/or on the metal gate 218 in the opening 502 such that the height of the second interconnect structure 322 continues to grow during the deposition operation. In other words, the material does not grow on the insulating sidewalls of the opening 502 and instead grows on the metal gate 218. The material is deposited into the opening 502 to fill the opening 502 up to (or near) the top of the oxide layer 212. In some implementations, the planarization tool 110 planarizes or polishes the second interconnect structure 322 after deposition of the material to form the second interconnect structure 322.

Figure 5D:
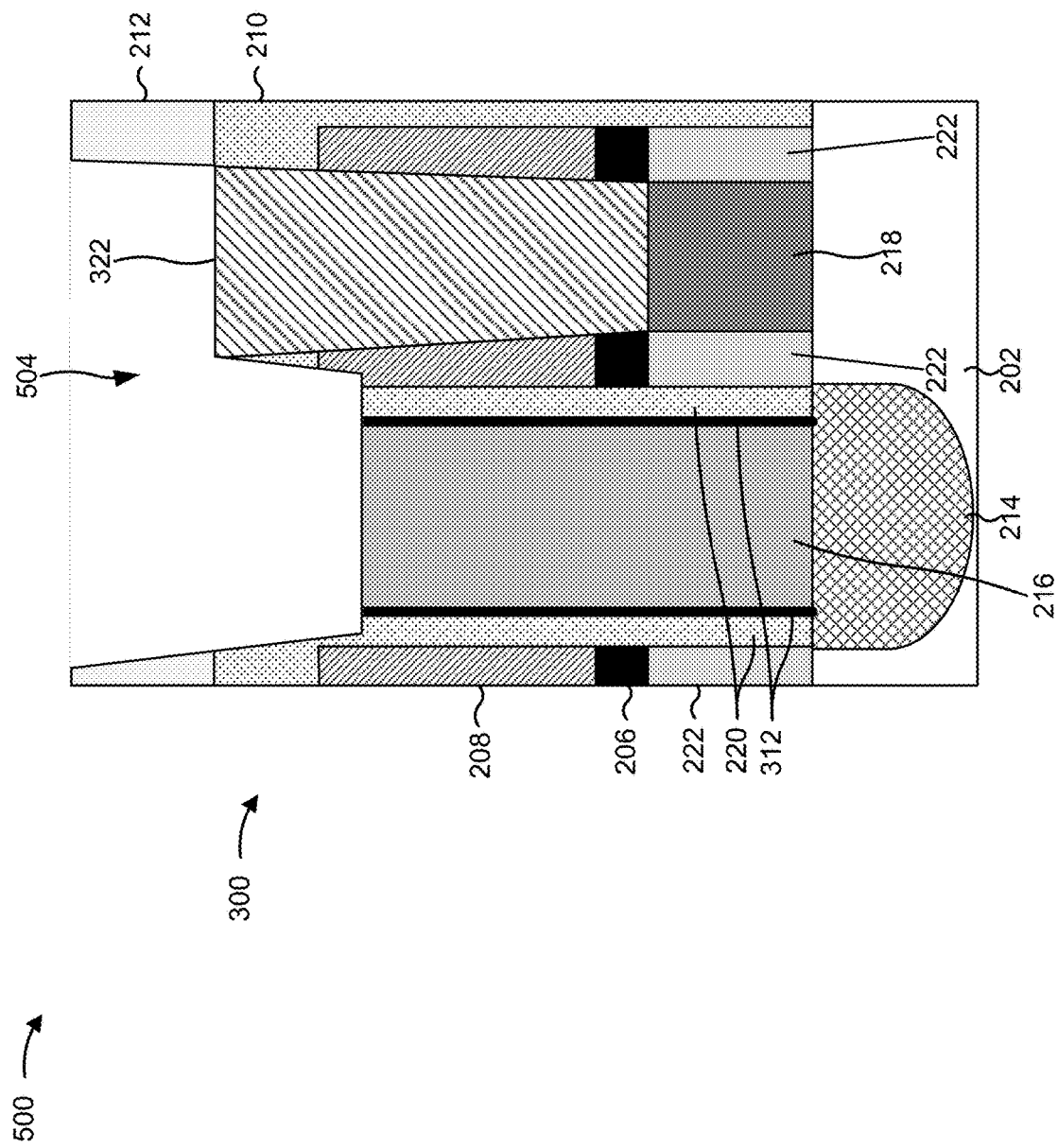

As shown in FIG. 5D, an etch operation is performed to remove a portion of the second interconnect structure 322 and to form an opening 504. The opening 504 is formed to the source/drain contact 216 to expose the source/drain contact 216, and also includes a portion of the opening 502 in which the portion of the second interconnect structure 322 is removed. The etch operation includes etching back the second interconnect structure 322 to at or near the top surface of the MCESL 210, and forming the opening 504 to the source/drain contact 216, in the same etch operation (e.g., a single etch operation).

The amount of material that is removed from the second interconnect structure 322 is approximately equal to the thickness of the oxide layer 212. As an example, the amount of material that is removed from the second interconnect structure 322 is in a range of approximately 1 nanometer to approximately 15 nanometers such that the height of the second interconnect structure 322 is approximately equal to the top surface of the MCESL 210, and such that a sufficient amount of the material is removed to minimize the likelihood of void formation in the first interconnect structure 320 and the second interconnect structure 322. However, other values for the amount of material that is removed from the second interconnect structure 322 is within the scope of the present disclosure.

In some implementations, a pattern in a photoresist layer is used to remove the portion of the second interconnect structure 322 and to expose the top of the source/drain contact 216. In these implementations, the deposition tool 102 forms the photoresist layer on the oxide layer 212 and on the second interconnect structure 322. The exposure tool 104 exposes the photoresist layer to a radiation source to pattern the photoresist layer. The developer tool 106 develops and removes portions of the photoresist layer to expose the pattern. The etch tool 108 etches the second interconnect structure 322 to remove the portion of the second interconnect structure 322. The etch tool 108 also removes portions of the oxide layer 212, the MCESL 210, and the dielectric layer 208 to expose the source/drain contact 216 in the same etch operation in which the etch tool 108 etches the second interconnect structure 322. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique.

Figure 5E:
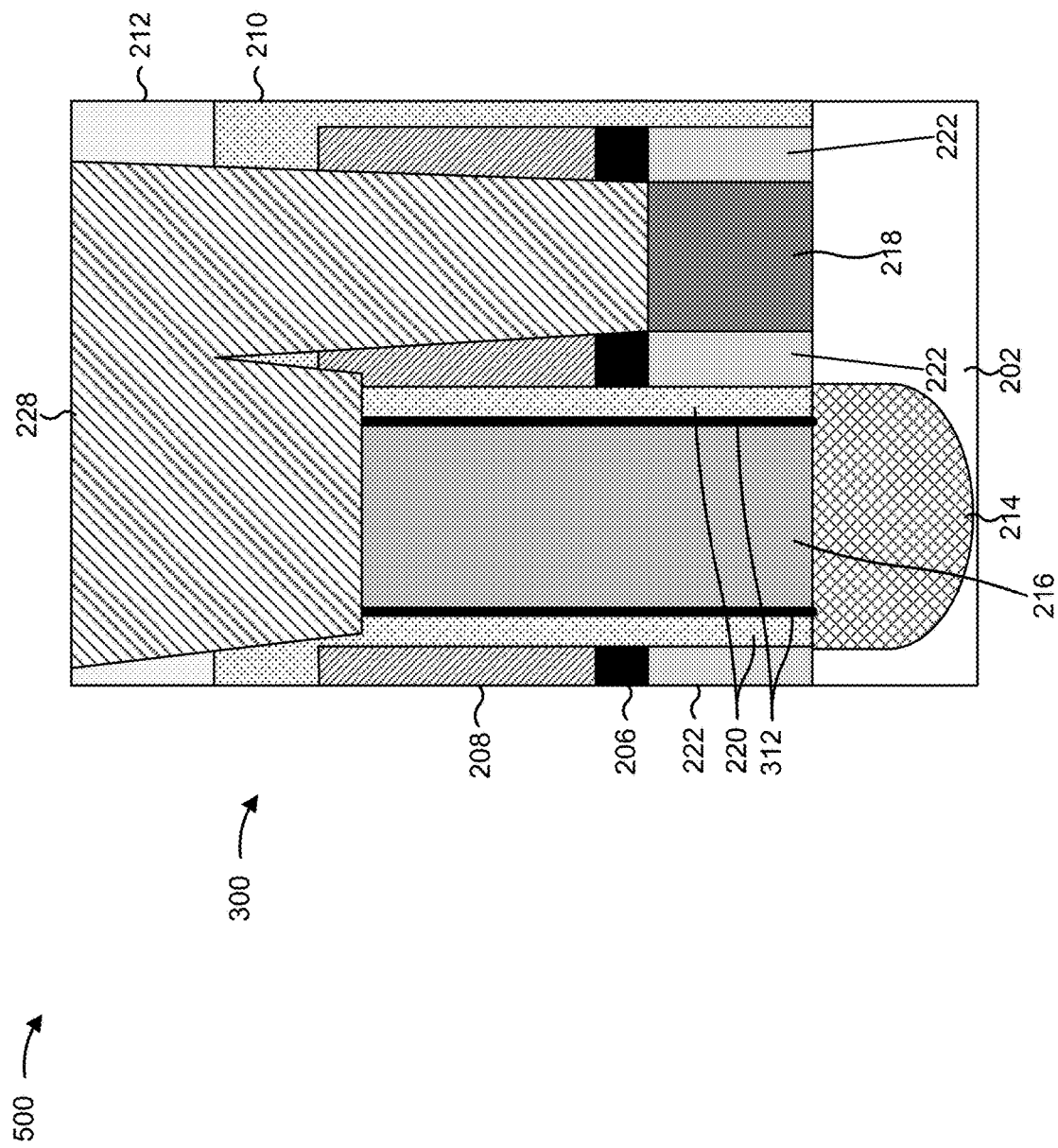

As shown in FIG. 5E, the opening 504 is filled with the material (e.g., tungsten (W) and/or another metal or conductive material) to form the first interconnect structure 320 and to fully fill the second interconnect structure 322 as part of a deposition operation. The formation of the first interconnect structure 320 and filling the second interconnect structure 322 results in the formation of the BCT 228. Etching back the second interconnect structure 322 (e.g., to at or near the MCESL 210, or to another depth) enables the deposition operation to fill the first interconnect structure 320 and the remaining portion of the second interconnect structure 322 to start at or near similar depths. In this way, the likelihood that the first interconnect structure 320 will be completed first and close the second interconnect structure 322 before the second interconnect structure 322 can be fully formed (which might otherwise result in the formation of a void in the second interconnect structure 322) is reduced and/or minimized. The deposition tool 102 and/or the plating tool 112 deposits (e.g., by CVD, ALD, electroplating, and/or another deposition technique) the material in the opening 504 using a bottom-up selective growth technique, as described herein.

As indicated above, FIGS. 5A-5E are provided as examples. Other examples may differ from what is described with regard to FIGS. 5A-5E.

Figure 6:
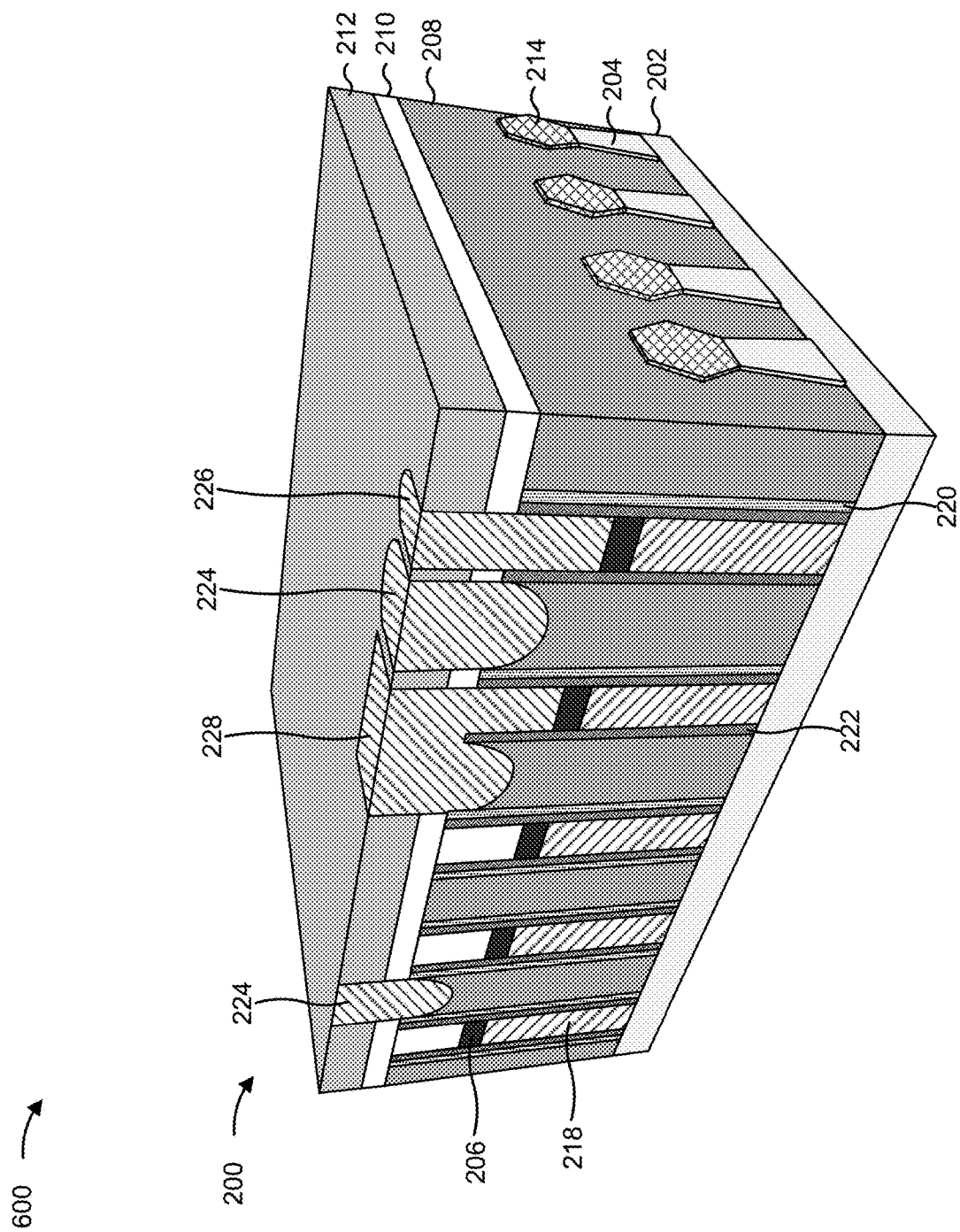
FIG. 6 is a diagram of an example fin field effect transistor (finFET) implementation of an example semiconductor device described herein.

FIG. 6 is a diagram of an example finFET implementation 600 of the semiconductor device 200 described herein. As shown in FIG. 6, the fins 204 of the semiconductor device 200 extend from the substrate 202. The epitaxial regions 214 are formed on the fins 204. The dielectric layer 208 surrounds the epitaxial regions 214 and the fins 204 to provide electrical isolation. The source/drain contacts 216 (not shown in FIG. 6) electrically connect to the epitaxial regions 214. The source or drain interconnects 224 extend downward through the oxide layer 212, the MCESL 210, and into the dielectric layer 208 to electrically connect to the source/drain contacts 216.

As further shown in FIG. 6, the source/drain contacts 216 and the metal gates 218 are electrically isolated by the sidewall spacers 222. Additional isolation may be provided by the barrier layers 220. One or more of the metal gates 218 are electrically connected to gate interconnects 226 that extend downward through the oxide layer 212, the MCESL 210, into the dielectric layer 208. Moreover, the gate interconnects 226 extend through the capping layer 206 to physically contact the one or more metal gates 218.

BCTs 228 electrically connect one or more pairs of metal sources or drains 216 and metal gates 218. The BCTs 228 extend downward through the oxide layer 212, the MCESL 210, into the dielectric layer 208 to electrically connect the one or more pairs of metal sources or drains 216 and metal gates 218. The BCTs 228 included in the example finFET implementation 600 may be formed using one or more of the BCT formation techniques described herein, such as the techniques described in connection with FIGS. 4A-4F and/or in connection with FIGS. 5A-5E, among other examples.

As indicated above, FIG. 6 is provided as an example. Other examples may differ from what is described with regard to FIG. 6.

Figure 7:
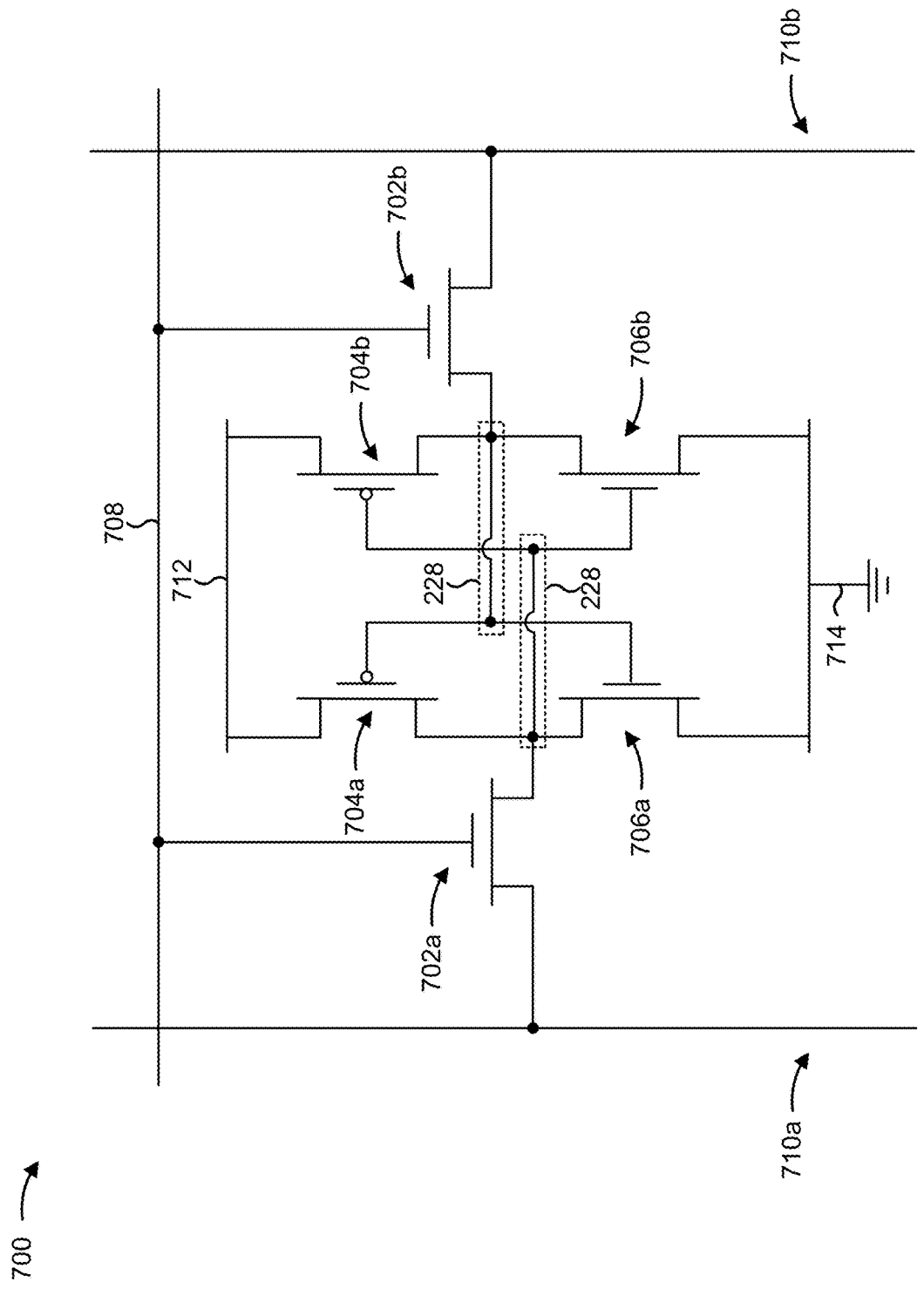
FIG. 7 is a diagram of an example memory device described herein.

FIG. 7 is a diagram of an example memory cell 700 described herein. The example memory cell 700 includes an example of a 6-transistor (6T) static random access memory (SRAM) cell that includes a plurality of BCTs 228. The BCTs 228 may be used to reduce the manufacturing complexity of electrically connecting the transistors of the memory cell 700, and may be used to reduce the interconnect distances between the transistors (which may increase the operating speed and/or other performance parameters of the memory cell 700). The memory cell 700 may be included in the semiconductor device 200 and/or another semiconductor device.

As shown in FIG. 7, the memory cell 700 includes pass-gate transistors 702a and 702b, pull-up transistors 704a and 704b, and pull-down transistors 706a and 706b. The pass-gate transistors 702a and 702b includes n-type metal-oxide semiconductor (NMOS) transistors or p-type metal-oxide semiconductor (PMOS) transistors. The pull-up transistors 704a and 704b include PMOS transistors. The pull-down transistors 706a and 706b include NMOS transistors. In some implementations, the pass-gate transistors 702a and 702b, the pull-up transistors 704a and 704b, and/or pull-down transistors 706a and 706b include finFET transistors described herein. In some implementations, the pass-gate transistors 702a and 702b, the pull-up transistors 704a and 704b, and/or pull-down transistors 706a and 706b include other types of transistors such as GAA transistors and/or planar transistors, among other examples.

The gates of pass-gate transistors 702a and 702b are controlled by a word-line (WL) 708 that is used to select or activate the memory cell 700. The pull-up transistors 704a and 704b, and pull-down transistors 706a and 706b, are electrically connected in a latch configuration to store one or more electronic bits of information. A stored bit can be written into or read from the memory cell through bit lines (BL) 710a and 710b. The memory cell is powered through a positive power supply node ($V_{CC}$ or $V_{dd}$) 712 and power supply node ($V_{SS}$) 714, which may include an electrical ground.

As further shown in FIG. 7, BCTs 228 described herein are used to electrically connect various transistors in the memory cell 700. A BCT 228 is used to electrically connect the gates (e.g., the metal gate 218) of the pull-up transistor 704a and the pull-down transistor 706a with the drain (e.g., the source/drain contact 216) of the pull-down transistor 706b. Another BCT 228 is used to electrically connect the gates (e.g., the metal gate 218) of the pull-up transistor 704b and the pull-down transistor 706b with the drain (e.g., the source/drain contact 216) of the pull-down transistor 706a. The BCTs 228 included in the memory cell 700 may be formed using one or more of the BCT formation techniques described herein, such as the techniques described in connection with FIGS. 4A-4F and/or in connection with FIGS. 5A-5E, among other examples.

As indicated above, FIG. 7 is provided as an example. Other examples may differ from what is described with regard to FIG. 7.

Figure 8:
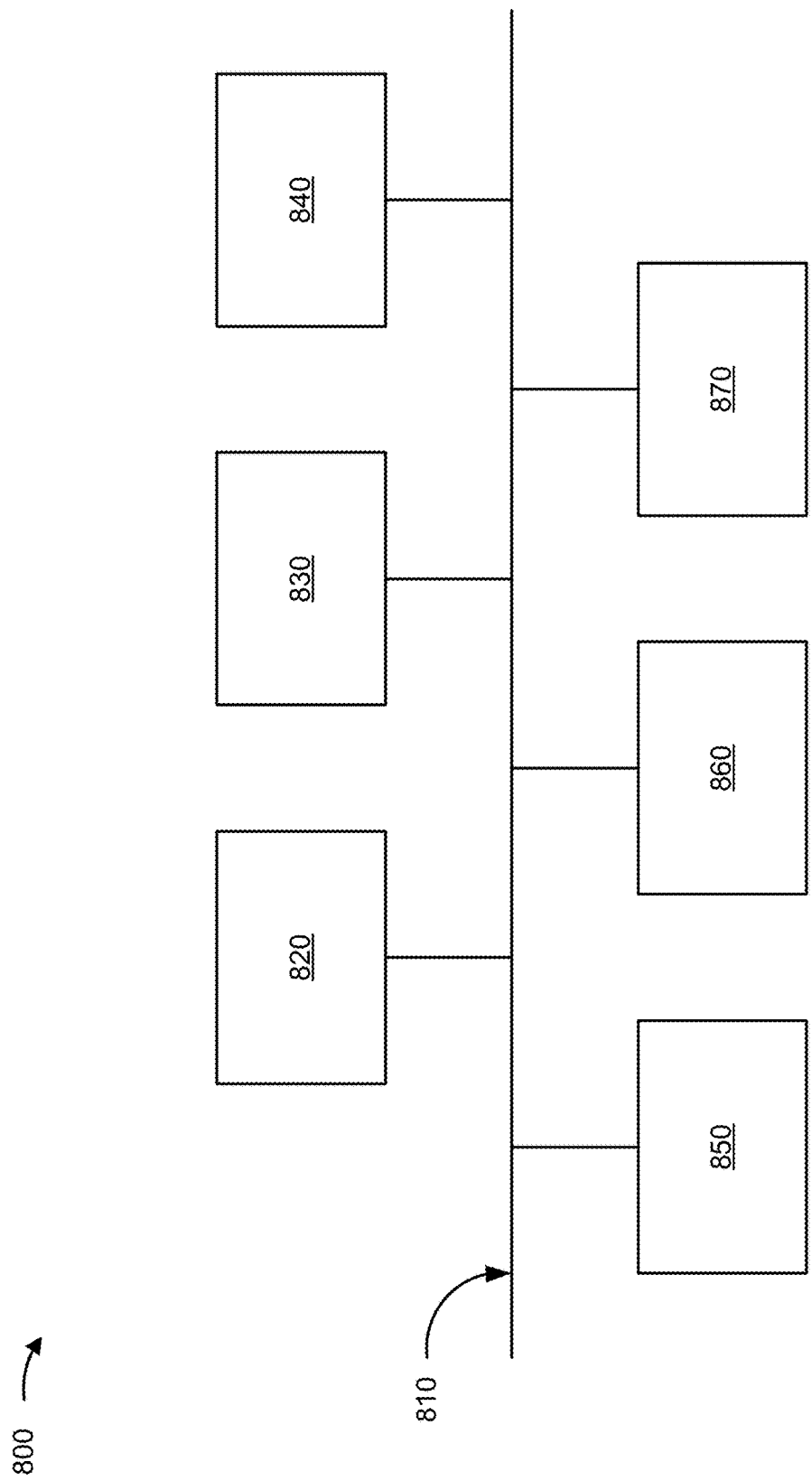
FIG. 8 is a diagram of example components of one or more devices of FIG. 1.

FIG. 8 is a diagram of example components of a device 800. In some implementations, one or more of the semiconductor processing tools 102-112 and/or the wafer/die transport tool 114 may include one or more devices 800 and/or one or more components of device 800. As shown in FIG. 8, device 800 may include a bus 810, a processor 820, a memory 830, a storage component 840, an input component 850, an output component 860, and a communication component 870.

Bus 810 includes a component that enables wired and/or wireless communication among the components of device 800. Processor 820 includes a central processing unit, a graphics processing unit, a microprocessor, a controller, a microcontroller, a digital signal processor, a field-programmable gate array, an application-specific integrated circuit, and/or another type of processing component. Processor 820 is implemented in hardware, firmware, or a combination of hardware and software. In some implementations, processor 820 includes one or more processors capable of being programmed to perform a function. Memory 830 includes a random access memory, a read only memory, and/or another type of memory (e.g., a flash memory, a magnetic memory, and/or an optical memory).

Storage component 840 stores information and/or software related to the operation of device 800. For example, storage component 840 may include a hard disk drive, a magnetic disk drive, an optical disk drive, a solid state disk drive, a compact disc, a digital versatile disc, and/or another type of non-transitory computer-readable medium. Input component 850 enables device 800 to receive input, such as user input and/or sensed inputs. For example, input component 850 may include a touch screen, a keyboard, a keypad, a mouse, a button, a microphone, a switch, a sensor, a global positioning system component, an accelerometer, a gyroscope, and/or an actuator. Output component 860 enables device 800 to provide output, such as via a display, a speaker, and/or one or more light-emitting diodes. Communication component 870 enables device 800 to communicate with other devices, such as via a wired connection and/or a wireless connection. For example, communication component 870 may include a receiver, a transmitter, a transceiver, a modem, a network interface card, and/or an antenna.

Device 800 may perform one or more processes described herein. For example, a non-transitory computer-readable medium (e.g., memory 830 and/or storage component 840) may store a set of instructions (e.g., one or more instructions, code, software code, and/or program code) for execution by processor 820. Processor 820 may execute the set of instructions to perform one or more processes described herein. In some implementations, execution of the set of instructions, by one or more processors 820, causes the one or more processors 820 and/or the device 800 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 8 are provided as an example. Device 800 may include additional components, fewer components, different components, or differently arranged components than those shown in FIG. 8. Additionally, or alternatively, a set of components (e.g., one or more components) of device 800 may perform one or more functions described as being performed by another set of components of device 800.

FIG. 9 is a flowchart of an example process 900 associated with forming a semiconductor device. In some implementations, one or more process blocks of FIG. 9 may be performed by one or more semiconductor processing tools (e.g., one or more of the semiconductor processing tools 102-112). Additionally, or alternatively, one or more process blocks of FIG. 9 may be performed by one or more components of device 800, such as processor 820, memory 830, storage component 840, input component 850, output component 860, and/or communication component 870.

As shown in FIG. 9, process 900 may include forming, for a first interconnect structure, a first opening in one or more layers of a semiconductor device (block 910). For example, one or more of the semiconductor processing tools 102-112 may form, for the first interconnect structure, a first opening (e.g., the opening 402, 502) in one or more layers (e.g., the layers 206, 208, 210, and/or 212) of the semiconductor device 200, as described above. In some implementations, the first opening (e.g., the opening 402, 502) is formed to a first contact (e.g., the metal gate 218) in the semiconductor device 200.

As further shown in FIG. 9, process 900 may include filling the first opening with a material to form the first interconnect structure (block 920). For example, one or more of the semiconductor processing tools 102-112 may fill the first opening (e.g., the opening 402, 502) with a material to form the first interconnect structure, as described above.

As further shown in FIG. 9, process 900 may include removing a portion of the first interconnect structure (block 930). For example, one or more of the semiconductor processing tools 102-112 may remove a portion of the first interconnect structure, as described above.

As further shown in FIG. 9, process 900 may include forming, for a second interconnect structure, a second opening in the one or more layers (block 940). For example, one or more of the semiconductor processing tools 102-112 may form, for the second interconnect structure, a second opening (e.g., the opening 404, 504) in the one or more layers (e.g., the layers 206, 208, 210, and/or 212), as described above. In some implementations, the second opening (e.g., the opening 404, 504) is formed to a second contact (e.g., the source/drain contact 216) of the semiconductor device 200.

As further shown in FIG. 9, process 900 may include filling the second opening with the material to form the second interconnect structure (block 950). For example, one or more of the semiconductor processing tools 102-112 may fill the second opening (e.g., the opening 404, 504) with the material to form the second interconnect structure, as described above.

As further shown in FIG. 9, process 900 may include filling a remaining portion of the first opening with the material (block 960). For example, one or more of the semiconductor processing tools 102-112 may fill a remaining portion of the first opening (e.g., the opening 402, 404) with the material, as described above.

Process 900 may include additional implementations, such as any single implementation or any combination of implementations described below and/or in connection with one or more other processes described elsewhere herein.

In a first implementation, the first opening (e.g., the opening 402, 502) and the second opening (e.g., the opening 404, 504) are adjoining openings, and the first interconnect structure and the second interconnect structure include a BCT 228 that electrically connects the first contact (e.g., the metal gate 218) and the second contact (e.g., the source/drain contact 216). In a second implementation, alone or in combination with the first implementation, the second opening (e.g., the opening 404, 504) and the remaining portion of the first opening (e.g., the opening 402, 502) are filled with the material in a single deposition operation. In a third implementation, alone or in combination with one or more of the first and second implementations, the portion of the first interconnect structure is removed, and the second opening (e.g., the opening 504) is formed, in a single etch operation.

In a fourth implementation, alone or in combination with one or more of the first through third implementations, removing the portion of the first interconnect structure includes removing the portion of the first interconnect structure in a first etch operation, and forming the second opening (e.g., the opening 404) in a second etch operation that is subsequent to the first etch operation. In a fifth implementation, alone or in combination with one or more of the first through fourth implementations, removing the portion of the first interconnect structure includes etching the first interconnect structure approximately down to the MCESL 210 of the semiconductor device 200. In a sixth implementation, alone or in combination with one or more of the first through fifth implementations, removing the portion of the first interconnect structure includes removing approximately 1 nanometer to approximately 15 nanometers of the first interconnect structure.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

In this way, a BCT may be formed in a semiconductor device using one or more of the void-free (or near void-free) techniques described herein. A first interconnect structure (e.g., a gate interconnect) of the BCT is etched and filled. The first interconnect structure is then etched back such that a portion of the first interconnect structure is removed. The first interconnect structure is etched back to a depth that is near a starting depth of a second interconnect structure (e.g., a source or drain interconnect) of the BCT, then the second interconnect structure and the remaining portion of the first interconnect structure may be filled. In this way, the height of the remaining portion of the first interconnect structure that is to be filled is closer to the height of the second interconnect structure when the second interconnect structure is filled relative to fully filling the second interconnect structure and fully filling the first interconnect structure in a single deposition operation. This reduces the likelihood that filling the second interconnect structure will close the first interconnect structure before the first interconnect structure can be fully filled. This reduces defects in the semiconductor device, decreases the likelihood that defects will be propagated throughout the semiconductor device, reduces contact resistance in the semiconductor device, improves the performance of the semiconductor device, decreases the occurrence of interconnect failures, and/or increases manufacturing yield and quality for the semiconductor device.

As described in greater detail above, some implementations described herein provide a semiconductor device. The semiconductor device includes a metal gate. The semiconductor device includes a source/drain contact. The semiconductor device includes a contact electrically connecting the metal gate and the source/drain contact, including a first interconnect structure connected to the metal gate a second interconnect structure connected to the source/drain contact. A portion of a sidewall of the second interconnect structure is separated from a portion of an abutting sidewall of the first interconnect structure.

As described in greater detail above, some implementations described herein provide a method. The method includes forming, for a first interconnect structure, a first opening in one or more layers of a semiconductor device, where the first opening is formed to a first contact in the semiconductor device. The method includes filling the first opening with a material to form the first interconnect structure. The method includes removing a portion of the first interconnect structure. The method includes forming, for a second interconnect structure, a second opening in the one or more layers, where the second opening is formed to a second contact of the semiconductor device. The method includes filling the second opening with the material to form the second interconnect structure. The method includes filling a remaining portion of the first opening with the material.

As described in greater detail above, some implementations described herein provide a semiconductor device. The semiconductor device includes a plurality of transistors. The semiconductor device includes a contact, electrically connecting a gate of a first transistor of the plurality of transistors and a source or drain of a second transistor of the plurality of transistors, including a first interconnect structure connected to the gate of the first transistor a second interconnect structure connected to the source or drain of the second transistor. A portion of a sidewall of the second interconnect structure is angled away from a portion of an abutting sidewall of the first interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a metal gate;
a source/drain contact;
a plurality of barrier layers, between the source/drain contact and the metal gate, including a first barrier layer, on a first side of the source/drain contact, and a second barrier layer, on a second side of the source/drain contact; and
a contact, electrically connecting the metal gate and the source/drain contact, comprising:
a first interconnect structure, extending entirely through a dielectric layer and a capping layer of the semiconductor device, connected to the metal gate; and
a second interconnect structure, extending partially through the dielectric layer, connected to the source/drain contact,
wherein a portion of a sidewall of the second interconnect structure is separated from a portion of an abutting sidewall of the first interconnect structure, and
wherein a width of a bottom surface of the second interconnect structure is greater relative to a width of a bottom surface of the first interconnect structure.

2. The semiconductor device of claim 1, wherein a height of a gap between the portion of the sidewall of the second interconnect structure and the abutting sidewall of the first interconnect structure is in a range of approximately 1 nanometer to approximately 20 nanometers.

3. The semiconductor device of claim 2, wherein the gap comprises a triangle-shaped gap, or
wherein the gap comprises a trapezoid-shaped gap.

4. The semiconductor device of claim 2, wherein the contact comprises a butted contact.

5. The semiconductor device of claim 1, wherein a width of a bottom of a gap between the portion of the sidewall of the second interconnect structure and the abutting sidewall of the first interconnect structure is in a range of approximately 1 angstrom to approximately 50 angstroms.

6. The semiconductor device of claim 5, wherein a width of a top of the gap is less than the width of the bottom of the gap.

7. The semiconductor device of claim 1, wherein a height of the first interconnect structure is greater relative to a height of the second interconnect structure.

8. The semiconductor device of claim 1, wherein the source/drain contact connects to an epitaxial region of a substrate.

9. A semiconductor device, comprising:
a plurality of transistors; and
a contact, electrically connecting a gate of a first transistor of the plurality of transistors and a source or drain of a second transistor of the plurality of transistors, comprising:
a first interconnect structure, extending entirely through a dielectric layer and a capping layer of the semiconductor device, connected to the gate of the first transistor; and
a second interconnect structure, extending partially through the dielectric layer, connected to the source or drain of the second transistor,
wherein a portion of a sidewall of the second interconnect structure is angled away from a portion of an abutting sidewall of the first interconnect structure, and
wherein a width of a bottom surface of the second interconnect structure is greater relative to a width of a bottom surface of the first interconnect structure.

10. The semiconductor device of claim 9, wherein an angle, between the portion of the abutting sidewall of the first interconnect structure, and a bottom surface of the first interconnect structure, is in a range of greater than approximately 90 degrees to approximately 95 degrees; and
wherein a width of the bottom surface is in a range of greater than approximately 8 nanometers to approximately 18 nanometers.

11. The semiconductor device of claim 9, wherein an angle, between the portion of the sidewall of the second interconnect structure, and a bottom surface of the second interconnect structure, is in a range of greater than approximately 90 degrees to approximately 95 degrees; and
wherein a width of the bottom surface is in a range of approximately 14 nanometers to approximately 40 nanometers.

12. The semiconductor device of claim 9, wherein a width of a bottom of a gap between the portion of the sidewall of the second interconnect structure and the abutting sidewall of the first interconnect structure is in a range of approximately 1 angstrom to approximately 50 angstroms.

13. The semiconductor device of claim 12, wherein a ratio, between the width of the bottom and a width of a top of the gap, is in a range of approximately 1:1 to approximately 50:1.

14. A semiconductor device, comprising:
a metal gate;
a source/drain contact;
a plurality of barrier layers, separating the source/drain contact and the metal gate, including a first barrier layer, on a first side of the source/drain contact, and a second barrier layer, on a second side of the source/drain contact; and
a contact electrically connecting the metal gate and the source/drain contact, comprising:

a first interconnect structure, extending entirely through a dielectric layer and a capping layer of the semiconductor device, connected to the metal gate; and a second interconnect structure, extending partially through the dielectric layer, connected to the source/drain contact, wherein a portion of a sidewall of the second interconnect structure is angled away from a portion of an abutting sidewall of the first interconnect structure, and wherein a width of a bottom surface of the second interconnect structure is greater relative to a width of a bottom surface of the first interconnect structure.

15. The semiconductor device of claim 14, wherein a height of a gap between the portion of the sidewall of the second interconnect structure and the abutting sidewall of the first interconnect structure is in a range of approximately 1 nanometer to approximately 20 nanometers.

16. The semiconductor device of claim 15, wherein the gap comprises a triangle-shaped gap, or wherein the gap comprises a trapezoid-shaped gap.

17. The semiconductor device of claim 15, wherein the contact comprises a butted contact.

18. The semiconductor device of claim 14, wherein a width of a bottom of a gap between the portion of the sidewall of the second interconnect structure and the abutting sidewall of the first interconnect structure is in a range of approximately 1 angstrom to approximately 50 angstroms.

19. The semiconductor device of claim 18, wherein a width of a top of the gap is less than the width of the bottom of the gap.

20. The semiconductor device of claim 14, wherein a height of the first interconnect structure is greater relative to a height of the second interconnect structure.

* * * * *